(12) United States Patent
Iwamizu

(10) Patent No.: US 11,594,502 B2
(45) Date of Patent: Feb. 28, 2023

(54) SEMICONDUCTOR DEVICE HAVING CONDUCTIVE FILM

(71) Applicant: FUJI ELECTRIC CO., LTD., Kanagawa (JP)

(72) Inventor: Morio Iwamizu, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 16/455,826

(22) Filed: Jun. 28, 2019

(65) Prior Publication Data

US 2019/0326237 A1 Oct. 24, 2019

Related U.S. Application Data

(63) Continuation of application No. PCT/JP2018/021296, filed on Jun. 1, 2018.

(30) Foreign Application Priority Data

Jul. 13, 2017 (JP) .............................. JP2017-137066

(51) Int. Cl.
*H01L 23/00* (2006.01)
(52) U.S. Cl.
CPC .............. *H01L 24/05* (2013.01); *H01L 24/45* (2013.01); *H01L 2224/02205* (2013.01);
(Continued)
(58) Field of Classification Search
CPC ................................. H01L 23/00; H01L 24/05
(Continued)

(56) References Cited

U.S. PATENT DOCUMENTS 5,502,337 A * 3/1996 Nozaki ............... H01L 23/5283
257/773
6,100,591 A * 8/2000 Ishii .................... H01L 23/4824
257/750

(Continued)

FOREIGN PATENT DOCUMENTS

JP H03141661 A 6/1991
JP H04167449 A 6/1992
(Continued)

OTHER PUBLICATIONS

International Search Report for International Patent Application No. PCT/JP2018/021296, issued/mailed by the Japan Patent Office dated Jul. 31, 2018.
(Continued)

*Primary Examiner* — Sheng-Bai Zhu

(57) ABSTRACT

A semiconductor device includes first conductive films that are provided, above a semiconductor substrate, at least on both sides of a non-formation region in which the first conductive films are not provided; an interlayer dielectric film including a first portion that is provided on the non-formation region, second portions provided above the first conductive film on both sides of the non-formation region, and a step portion that connects the first portion and the second portions; a second conductive film provided above the interlayer dielectric film; through terminal portions that penetrate the second portions of the interlayer dielectric film; and a wire bonded with the second conductive film above the first portion, where the through terminal portions include one or more first through terminal portions and one or more second through terminal portions being provided at positions opposite to each other with a bonded portion of the wire being interposed therebetween.

13 Claims, 15 Drawing Sheets

(52) U.S. Cl.
CPC ............... *H01L 2224/02381* (2013.01); *H01L 2224/04042* (2013.01); *H01L 2224/05647* (2013.01); *H01L 2224/4847* (2013.01); *H01L 2224/48647* (2013.01)

(58) Field of Classification Search
USPC ........................................................ 257/741
See application file for complete search history.

(56) References Cited

U.S. PATENT DOCUMENTS

| | | | | |
|---|---|---|---|---|
| 6,448,641 | B2* | 9/2002 | Ker ..................... | H01L 23/5222 257/700 |
| 2002/0000668 | A1* | 1/2002 | Sakihama ............... | H01L 24/05 257/758 |
| 2004/0070042 | A1* | 4/2004 | Lee ......................... | H01L 24/48 257/459 |
| 2004/0124537 | A1* | 7/2004 | Takayama ......... | H01L 23/53266 257/758 |
| 2005/0101117 | A1 | 5/2005 | Ozawa | |
| 2005/0121792 | A1* | 6/2005 | Harada ............. | H01L 21/76802 257/758 |
| 2006/0267142 | A1* | 11/2006 | Ota ..................... | H01L 23/5223 257/532 |
| 2006/0273463 | A1* | 12/2006 | Wakabayashi .......... | H01L 24/10 257/773 |
| 2007/0123009 | A1* | 5/2007 | Richter ............. | H01L 21/76808 438/479 |
| 2009/0230562 | A1* | 9/2009 | Kondou ................ | H01L 23/522 257/774 |
| 2009/0302473 | A1* | 12/2009 | Shibata ................ | H01L 23/522 257/751 |
| 2010/0019395 | A1* | 1/2010 | Zecri ....................... | H01L 24/48 257/782 |
| 2010/0031221 | A1* | 2/2010 | Greco .................... | G06F 30/39 716/130 |
| 2012/0196439 | A1* | 8/2012 | Kim .................. | H01L 21/76829 438/672 |
| 2015/0333026 | A1* | 11/2015 | Gandhi ................... | H01L 24/81 257/737 |
| 2017/0062362 | A1 | 3/2017 | Sekikawa | |

FOREIGN PATENT DOCUMENTS

| | | |
|---|---|---|
| JP | H05226339 A | 9/1993 |
| JP | H06216188 A | 8/1994 |
| JP | H06314722 A | 11/1994 |
| JP | H0817859 A | 1/1996 |
| JP | 2000100816 A | 4/2000 |
| JP | 2002016065 A | 1/2002 |
| JP | 2003282574 A | 10/2003 |
| JP | 2005142351 A | 6/2005 |
| JP | 2011018832 A | 1/2011 |
| JP | 2017045865 A | 3/2017 |

OTHER PUBLICATIONS (ISA/237) Written Opinion of the International Search Authority for International Application No. PCT/JP2018/021296, issued/mailed by the International Bureau of WIPO dated Jul. 31, 2018.

Office Action issued for counterpart Japanese Application No. 2019-528982, issued by the Japanese Patent Office on Sep. 8, 2020 (drafted on Sep. 2, 2020).

Office Action issued for counterpart Chinese Application 201880005672. 8, issued by The State Intellectual Property Office of People's Republic of China dated Nov. 25, 2022.

* cited by examiner

SEMICONDUCTOR DEVICE HAVING CONDUCTIVE FILM

The contents of the following Japanese patent applications are incorporated herein by reference:
NO. 2017-137066 filed in JP on Jul. 13, 2017, and
NO. PCT/JP2018/021296 filed on Jun. 1, 2018.

BACKGROUND

1. Technical Field

The present invention relates to a semiconductor device.

2. Related Art

For a semiconductor device, a structure in which an upper-layer conductive film and a lower-layer conductive film are connected to each other by a via has been known. A semiconductor device in which via holes are arranged in any portion other than a portion right below an electrode pad part to which a wire is connected in the upper-side conductive film has been known (for example, see Patent Document 1). Also, a semiconductor device in which a plurality of vias are divided into several groups and arranged in a portion surrounding a pad opening portion to prevent occurrence of electromigration caused by current crowding on some of the vias has been known (for example, see Patent Document 2 and Patent Document 3).

PATENT DOCUMENTS

| [Patent Document 1] | Japanese Patent Application Publication No. Hei4-167449 |
| [Patent Document 2] | Japanese Patent Application Publication No. 2002-16065 |
| [Patent Document 3] | Japanese Patent Application Publication No. Hei8-17859 |

In a semiconductor device, it is desirable that stress on a conductive film to which a wire is bonded is relaxed and peeling of the conductive film is prevented.

SUMMARY

A first aspect of the present invention provides a semiconductor device. The semiconductor device may include a semiconductor substrate. The semiconductor device may include a first conductive film. The first conductive film may be provided above the semiconductor substrate. The first conductive film may be provided at least on both sides of a non-formation region such that the non-formation region is interposed therebetween. The non-formation region may be a region in which the first conductive film is not provided. The semiconductor device may include an interlayer dielectric film. The interlayer dielectric film may include a first portion, a second portion and a step portion. The first portion may be provided on the non-formation region. The second portion may be provided above the first conductive film on both sides of the non-formation region such that the non-formation region is interposed therebetween. The step portion may connect the first portion and the second portion. The semiconductor device may include a second conductive film. The second conductive film may be provided above the interlayer dielectric film. The semiconductor device may include a plurality of through terminal portions. The plurality of through terminal portions may penetrate the second portion of the interlayer dielectric film. The plurality of through terminal portions may electrically connect the first conductive film and the second conductive film. The semiconductor device may include a wire. The wire may be bonded with the second conductive film above the first portion of the interlayer dielectric film. The plurality of through terminal portions may at least include one or more first through terminal portions and one or more second through terminal portions. The one or more first through terminal portions and the one or more second through terminal portions may be provided at positions opposite to each other with a bonded portion of the wire being interposed therebetween.

A thickness of the second conductive film above the first portion may be larger than a thickness of the second conductive film above the second portion.

The first conductive film may be formed in an annular shape surrounding the non-formation region. The plurality of through terminal portions may be arranged in an annular shape surrounding the non-formation region.

The second conductive film may extend in a longitudinal direction that is parallel to a front surface of the semiconductor substrate. A region in which the plurality of through terminal portions are arranged along the longitudinal direction may have a different density of he arranged through terminal portion from a regions in which the plurality of through terminal portions are arranged along a lateral direction orthogonal to the longitudinal direction.

The region in which the plurality of through terminal portions are arranged along the lateral direction may have a higher density of the arranged through terminal portion than the region in which the plurality of through terminal portions are arranged along the longitudinal direction.

A region in which the plurality of through terminal portions are arranged along a direction parallel to a direction in which the wire extends may have a higher density of the arranged through terminal portion than a region in which the plurality of through terminal portions are arranged along a direction orthogonal to the direction in which the wire extends.

The first conductive film may include a wiring film and a dummy film. Current may flow through the wiring film. The dummy film may be arranged on the opposite side to the wiring film with a bonded portion of the wire being interposed therebetween. Current may not flow through the dummy film. The wiring film may be electrically connected to the second conductive film through the first through terminal portion. The dummy film may be electrically connected to the second conductive film through the second through terminal portion. The wiring film and the dummy film may be electrically separated from each other.

The wire and the second conductive film may be formed of a material containing copper.

The thickness of the second conductive film may be 1 μm or more.

The first conductive film may have a groove portion. Ends of the plurality of through terminal portions may be respectively inserted into the groove portion.

The plurality of through terminal portions may be arranged in a plurality of columns.

A plurality of through terminal portions arranged in a first column along one direction and a plurality of through terminal portions arranged in a second column adjacent to the first column along the one direction may be arranged at positions in the one direction that are different from each other.

A second aspect of the present invention provides a semiconductor device. The semiconductor device may include a semiconductor substrate. The semiconductor device may include a first conductive film. The first conductive film may be provided above the semiconductor substrate. The semiconductor device may include an interlayer dielectric film. The interlayer dielectric film may cover the first conductive film. The semiconductor device may include a second conductive film. The second conductive film may be provided above the interlayer dielectric film. The semiconductor device may include a wire. The wire may be bonded to the second conductive film. The semiconductor device may include a plurality of through terminal portions. The plurality of through terminal portions may penetrate the interlayer dielectric film and electrically connect the first conductive film and the second conductive film. The first conductive film may include a wiring film and a dummy film. Current may flow through the wiring film. The dummy film may be arranged on the opposite side to the wiring film with a bonded portion of the wire being interposed therebetween. Current may not flow through the dummy film. The wiring film may be electrically connected to the second conductive film through the first through terminal portion. The dummy film may be electrically connected to the second conductive film through the second through terminal portion. The wiring film and the dummy film may be electrically separated from each other. The plurality of through terminal portions may at least include one or more first through terminal portions and one or more second through terminal portions. The one or more first through terminal portions may electrically connect the wiring film and the second conductive film. The one or more second through terminal portions may electrically connect the wiring film and the second conductive film.

The summary clause does not necessarily describe all necessary features of the embodiments of the present invention. The present invention may also be a sub-combination of the features described above.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

In the present specification, the technical matters are described using orthogonal coordinate axes of X axis, Y axis and Z axis.

The orthogonal coordinate axes merely specify relative positions of components, and are not intended to limit specific directions. For example, the Z axis does not exclusively indicate a height direction relative to the ground. Note that a positive Z-axis direction and a negative Z-axis direction are directions opposite to each other. If the Z-axis direction is referred to without specifying whether it is positive or negative, it means a direction parallel to the positive Z-axis and the negative Z-axis.

Figure 1:
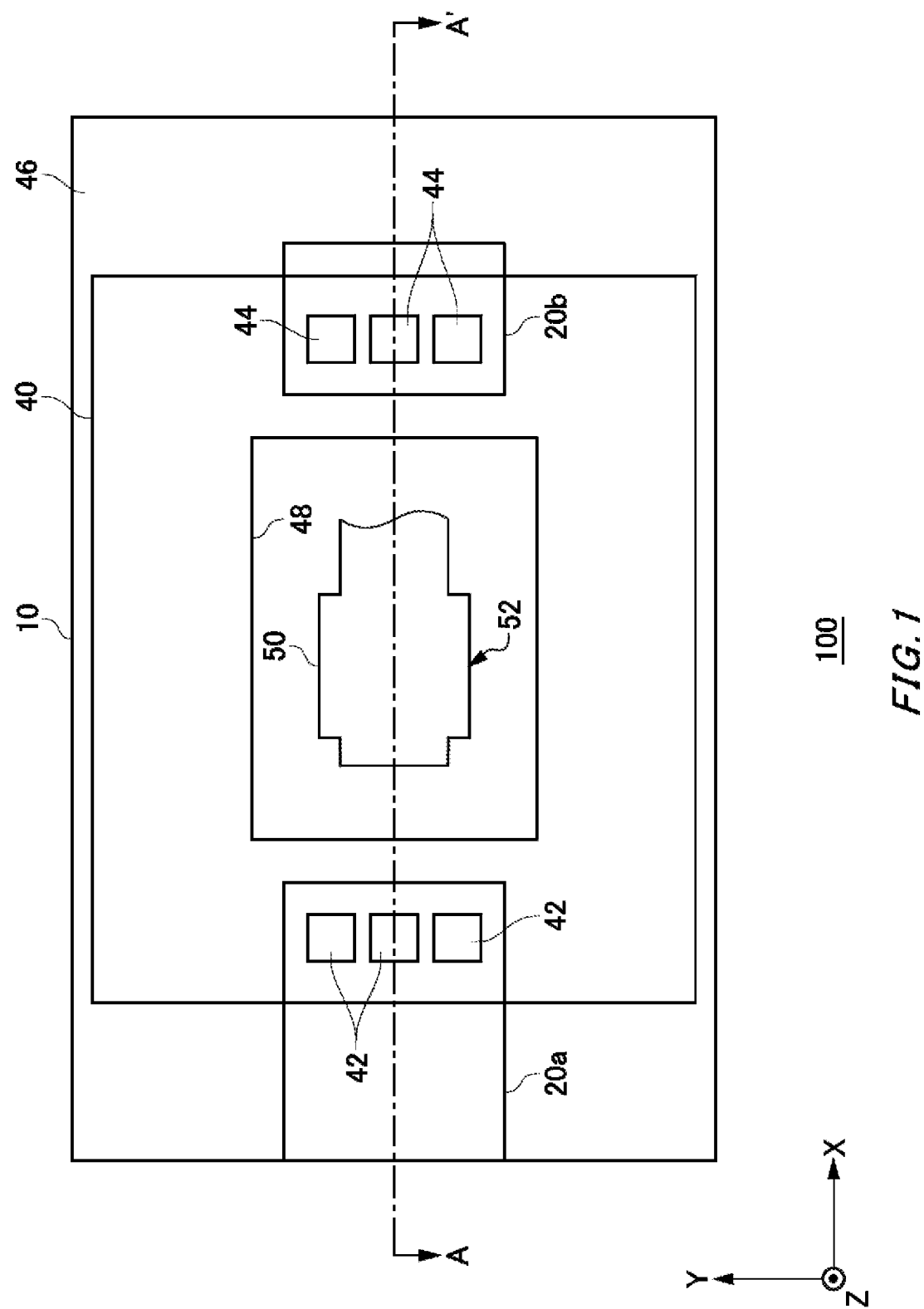
FIG. 1 shows a front surface of a semiconductor device 100 in a first embodiment of the present invention.
Figure 2:
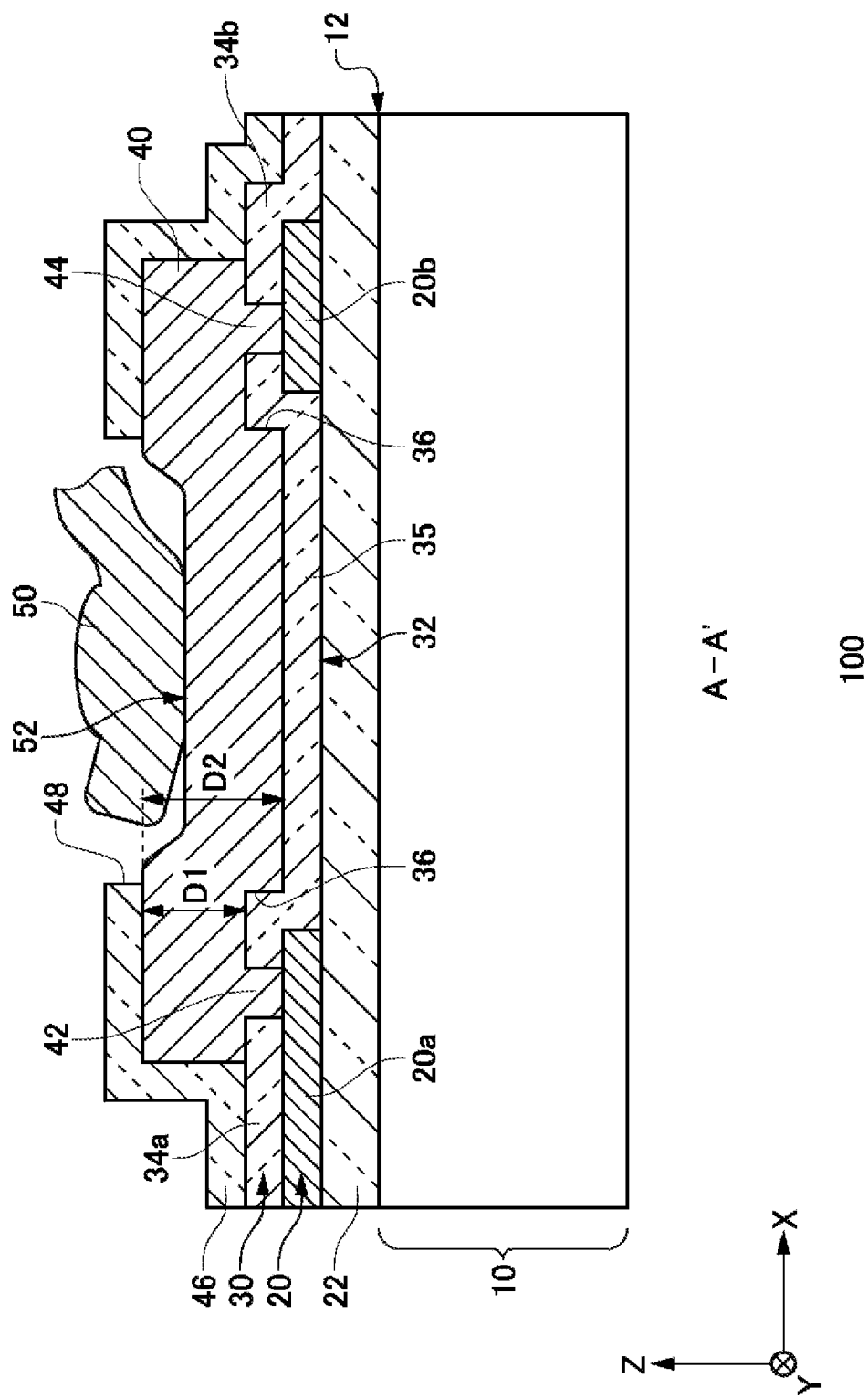
FIG. 2 shows one example of the cross section A-A' in FIG. 1.

FIG. 1 shows a front surface of a semiconductor device 100 in a first embodiment of the present invention. FIG. 2 shows one example of the cross section A-A' in FIG. 1. As shown in FIG. 2, the semiconductor device 100 includes a semiconductor substrate 10, a first conductive film 20, an interlayer dielectric film 30, a second conductive film 40 and a wire 50. The semiconductor device 100 includes one or more first vias 42 and one or more second vias 44. A protective film 46 is formed above the semiconductor device 100. An opening 48 is provided in the protective film 46. Actually, the front surface of the semiconductor device 100, excluding a region of the opening 48 in the protective film 46, may be covered by the protective film 46. However, in FIG. 1, for convenience of explanation, structures that are covered by the protective film 46 and the like and are not exposed are also shown by solid lines.

As shown in FIG. 2, in the present example, an insulating film 22 is formed on a front surface 12 of the semiconductor substrate 10. The semiconductor substrate 10 of the present example is a silicon (hereinafter, Si) substrate. In another example, the semiconductor substrate 10 may also be a compound semiconductor substrate such as silicon carbide (SiC). The insulating film 22 may also be a tetraethylorthosilicate film (TEOS film). The insulating film 22 may also be stacked film in which a TEOS film, a spin-on-glass (SOG) film and a TEOS film are stacked in this arrangement order. The insulating film 22 may also be a semiconductor oxide film such as silicon oxide, and may also be a semiconductor nitride film such as silicon nitride.

A first conductive film 20 is provided above the semiconductor substrate 10. In the present example, the first conductive film 20 is formed on the insulating film 22. However, the first conductive film 20 is not necessarily provided on all regions above the semiconductor substrate 10. A non-formation region 32 in which the first conductive film 20 is not provided is provided above the semiconductor substrate 10. The thickness of the first conductive film 20 is, for example, 0.3 μm or more and 1 μm or less, and more preferably, is 0.5 μm or more and 0.7 μm or less.

The first conductive film 20 may be formed of aluminum alloy, and may also be formed of copper alloy. The first conductive film 20 may also be a single film, and may also be a stacked film. For example, the first conductive film 20 is a stacked film including barrier metal on the insulating film 22 side. The barrier metal is, for example, a stacked film of titanium (Ti) film and a titanium nitride (TiN) film. In one example, the first conductive film 20 may be a stacked film in which a Ti film, a TiN film and an aluminum alloy film are stacked in this order from the side near the insulating film 22. Also, the first conductive film 20 is not limited to a metal film and may have a poly silicon film.

In the present example, the non-formation region 32 is provided below the bonded portion 52 between the wire 50 and the second conductive film 40. The first conductive film 20 is provided at least on both sides of the non-formation region 32 such that the non-formation region 32 is interposed therebetween. In the present example, the first conductive film 20 includes a wiring film 20a and a dummy film 20b. In the present example, the wiring film 20a is disposed on one side of the non-formation region 32 (in a negative X-axis direction), and the dummy film 20b is disposed on the other side of the non-formation region 32 (in a positive X-axis direction). In other words, the wiring film 20a is provided on one side of the bonded portion 52 with the bonded portion 52 of the wire 50 as a reference, and the dummy film 20b is provided on the other side of the bonded portion 52.

The wiring film 20a may be connected to a circuit portion in the semiconductor device 100. Current flow s through the wiring film 20a. The circuit portion to which the wiring film 20a is connected may be a control circuit portion in the semiconductor device 100, and may also be a power element portion. On the other hand, the dummy film 20b is not connected to the circuit portion in the semiconductor device 100. Current does not flow through the dummy film 20b. The wiring film 20a and the dummy film 20b may be electrically separated from each other. Because the dummy film 20b is not connected to the circuit portion, the dummy film 20b may not extend to the circuit portion. Therefore, an area occupied by the dummy film 20b may be small. However, different from the present example, the dummy film 20b may not be included. In this case, the wiring film 20a may be provided at least on both sides of the non-formation region 32 such that the non-formation region 32 is interposed therebetween.

The first conductive film 20 has a thinner thickness than the second conductive film 40. Therefore, fine process is performed on the first conductive film 20 more easily compared to the second conductive film 40. For this reason, for a manufacturing process, that the circuit portion is connected through the first conductive film 20 is more advantageous compared to a case where the second conductive film 40 keeps extending and is connected to the circuit portion.

In the present example, the interlayer dielectric film 30 covers the first conductive film 20 and the non-formation region 32. The interlayer dielectric film 30 includes a first portion 35, a second portion 34 (34a and 34b) and a step portion 36. The first portion 35 is provided to the non-formation region 32. In the present example, the first portion 35 is provided on the insulating film 22 in the non-formation region 32. The second portion 34 is provided above the first conductive film 20 on both sides of the non-formation region 32 such that the non-formation region 32 is interposed therebetween. In the present example, the second portion 34a of the interlayer dielectric film 30 is provided on the wiring film 20a of the first conductive film 20, and the second portion 34b of the interlayer dielectric film 30 is provided on the dummy film 20b of the first conductive film 20.

The step portion 36 of the interlayer dielectric film 30 connects the first portion 35 and the second portion 34. As shown in FIG. 2, the step portion 36 is provided in the Z-axis direction between an upper surface of the first portion 35 of the interlayer dielectric film 30 and an upper surface of the second portion 34 (34a and 34b) of the interlayer dielectric film 30. The length of the step portion 36 in the Z-axis direction may correspond to the thickness of the first conductive film 20. The step portion 36 connects the upper surface of the first portion 35 and the upper surface of the second portion 34. The first portion 35, the second portion 34 and the step portion 36 may be integrally formed of the same insulating material. The interlayer dielectric film 30 may be formed of a similar material to the insulating film 22. Specifically, the interlayer dielectric film 30 may be a TEOS film, and may also be a stacked film of a TEOS film, a SOG film and a TEOS film.

The second conductive film 40 is provided above the interlayer dielectric film 30. The thickness of the second conductive film 40 may be larger than the thickness of the first conductive film 20. In one example, the thickness of the second conductive film 40 may be 1 μm or more, and may be 3 μm or more. In this manner, by making the thickness of the second conductive film 40 thick, an impact at the time of bonding the wire 50 with the upper surface of the second conductive film 40 is absorbed. Therefore, cracks are prevented from occurring in the interlayer dielectric film 30, and the interlayer dielectric film 30 is protected.

In the present example, because the interlayer dielectric film 30 has the step portion 36, a step may be present on an upper surface of the second conductive film 40. Also, when a position of the uppermost part of the upper surface of the second conductive film 40 in the Z-axis direction is taken as a reference, if a distance from the reference to a back surface of the second conductive film 40 along the Z-axis direction is defined as a thickness, a thickness D2 of the second conductive film 40 above the first portion 35 may be larger than a thickness D1 of the second conductive film 40 above the second portions 34a and 34b.

The second conductive film 40 may be formed of a similar material to the first conductive film 20. Specifically, the second conductive film 40 may be formed of a material containing copper (Cu). However, different from the present example, the second conductive film 40 may be formed of aluminum alloy. The second conductive film 40 may be a single film, and may also be a stacked film. For example, the second conductive film 40 is a stacked film including barrier metal on the interlayer dielectric film 30 side. The barrier metal is, for example, a stacked film of a titanium (Ti) film and a titanium nitride (TiN) film.

The second conductive film 40 shown in FIG. 1 and FIG. 2 has a rectangular planar shape extending in the X-axis direction. However, the second conductive film 40 is not limited to this case, and the second conductive film 40 may have a circular, oval or another planar shape.

At least a region of the first conductive film 20 and a region of the second conductive film 40 partially overlap with each other when viewed from a direction orthogonal to the front surface 12 of the semiconductor substrate 10 (the positive Z-axis direction). In the present example, in the second conductive film 40 extending in the X-axis direction, the first conductive film 20 (the wiring film 20a) is provided so as to cross a first short side along the Y-axis direction, and the first conductive film 20 (the dummy film 20b) is provided so as to cross a second short side that is opposite to the first short side and along the Y-axis direction.

The protective film 46 is provided above the second conductive film 40. The protective film 46 may be formed on the second conductive film 40 and on the interlayer dielectric film 30. The opening 48 is formed in the protective film 46. A region of the second conductive film 40 exposed by the opening 48 functions as a bonding pad. The opening 48 may be provided above the first portion 35 of the interlayer dielectric film 30. At least a region of the opening 48 and a region of the first portion 35 of the interlayer dielectric film 30 may partially overlap with each other when viewed from the direction orthogonal to the front surface 12 of the semiconductor substrate 10 (the Z-axis direction).

The semiconductor device 100 includes a plurality of vias (42, 44). The plurality of vias (42, 44) are one example of the plurality of through terminal portions. The vias (42, 44) penetrate the second portions 34a and 34b of the interlayer dielectric film 30 in the Z-axis direction. The vias (42, 44) are provided in a region in which the regions of the first conductive films 20a and 20b and a region of the second conductive film 40 overlap with each other when viewed from the direction orthogonal to the front surface 12 of the semiconductor substrate 10 (the Z-axis direction). The vias (42, 44) electrically connect the first conductive film 20 and the second conductive film 40.

In one example, the vias (42, 44) may be formed by embedding a part of the second conductive film 40 into via holes that are provided in the second portions 34a and 34b of the interlayer dielectric film 30. Alternatively, conductive material such as tungsten (W), different from the second conductive film 40, may be embedded into the via holes to form the vias (42, 44).

The wire 50 is bonded with the second conductive film 40 above the first portion 35 of the interlayer dielectric film 30. The wire 50 may be formed of a material containing copper (Cu). However, different from the present example, the wire 50 may be a gold (Au) wire, an Al wire, or an alloy wire including Al. The wire 50 may be bonded with the region of the second conductive film 40 exposed by the opening 48 provided in the protective film 46. When viewed from the direction orthogonal to the front surface 12 of the semiconductor substrate 10 (the Z-axis direction), the position of the bonded portion 52 of the wire 50 and the positions to which the plurality of vias (42, 44) are provided do not overlap with each other. Accordingly, when bonding the wire 50, cracks can be prevented from occurring in the interlayer dielectric film 30 from the vias (42, 44) as a start point.

The plurality of vias (42, 44) at least include one or more first vias 42 and one or more second vias 44 that are provided at positions opposite to each other with the bonded portion 52 of the wire 50 being interposed therebetween. The first via 42 and the second via 44 are respectively one example of the first through terminal portion and the second through terminal portion. In the present example, as shown in FIG. 1, in the second conductive film 40 extending in the X-axis direction, a plurality of first vias 42 are arranged along a first short side along the Y-axis direction orthogonal to the extending direction, and a plurality of second vias 44 are arranged along a second short side that is opposite to the first short side and along the Y-axis direction.

In the present example, the wiring film 20a of the first conductive film 20 is electrically connected to the second conductive film 40 through the plurality of first vias 42. On the other hand, the dummy film 20b is electrically connected to the second conductive film 40 through the plurality of second vias 44. The plurality of first vias 42 penetrate the second portion 34a of the interlayer dielectric film 30 provided on the wiring film 20a. The plurality of second vias 44 penetrate the second portion 34b of the interlayer dielectric film 30 provided on the dummy film 20b.

Figure 3:
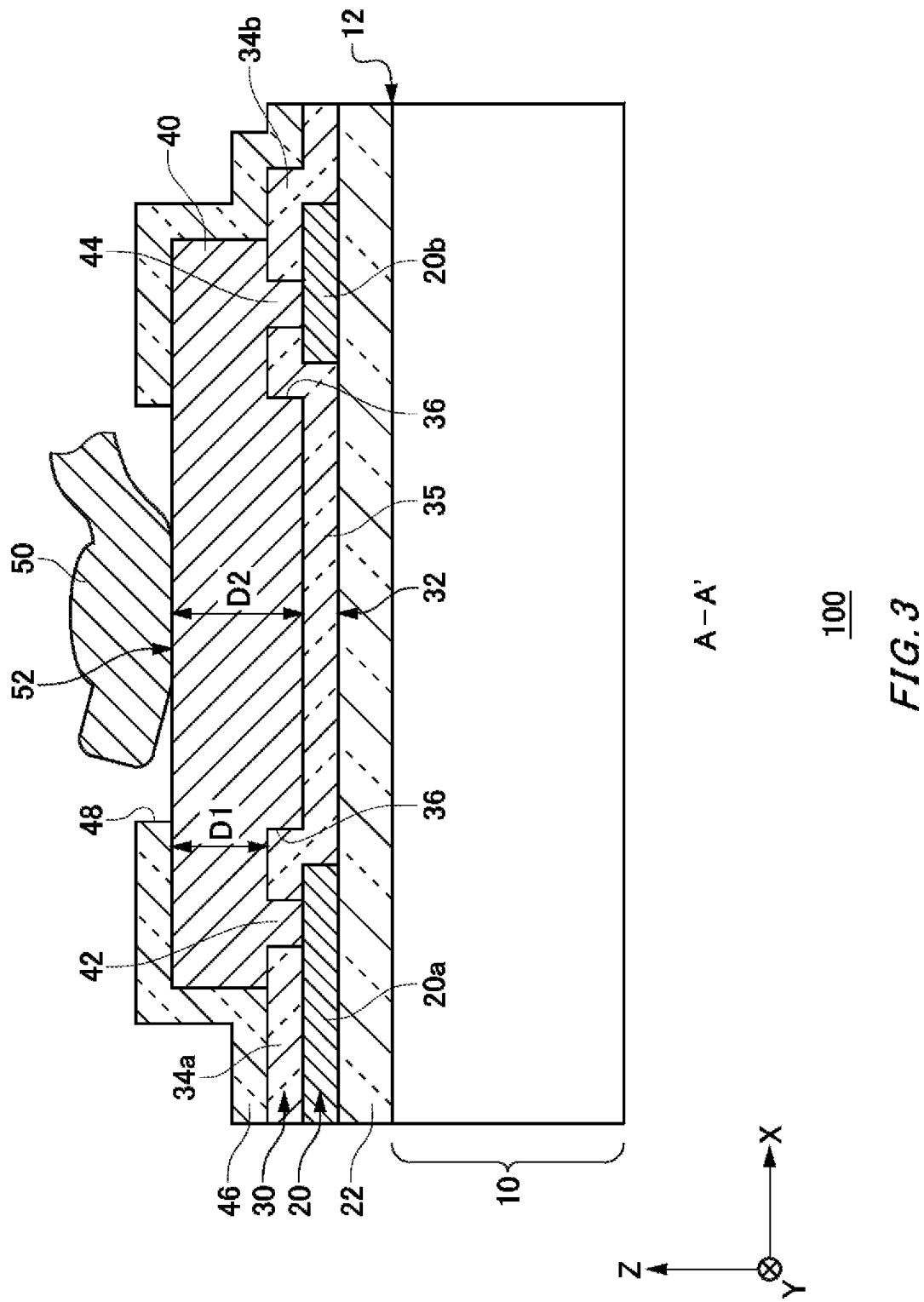
FIG. 3 shows another example of the cross section A-A' in FIG. 1.

FIG. 3 shows another example of the cross section A-A' in FIG. 1. In an example shown in FIG. 3, there is no step on the upper surface of the second conductive film 40. The structure shown in FIG. 3 may be realized by a planarization treating process of planarizing the upper surface of the second conductive film 40. Excluding the cross-sectional shape of the second conductive film 40, the structure of the semiconductor device 100 shown in FIG. 3 is similar to the structure of the semiconductor device 100 shown in FIG. 1 and FIG. 2. Therefore, the repetitive description is omitted. In the present example, if a thickness of the second conductive film 40 along the Z-axis direction is defined as the thickness of the second conductive film 40, the thickness D2 of the second conductive film 40 above the first portion 35 may be larger than the thickness D1 of the second conductive film 40 above the second portions 34a and 34b. Because the thickness of the second conductive film 40 above the first portion is thick, the impact at the time of bonding the wire 50 with the second conductive film 40 can be relaxed.

As can be seen in the illustrated example of FIG. 3, the second conductive film 40 overlying the first step portion 36, the second step portion 36, and the second portions 34a and 34b of the interlayer dielectric film 30 is entirely of the second uniform thickness D1, excluding material inside the plurality of through terminal portions 42 and 44.

Figure 4:
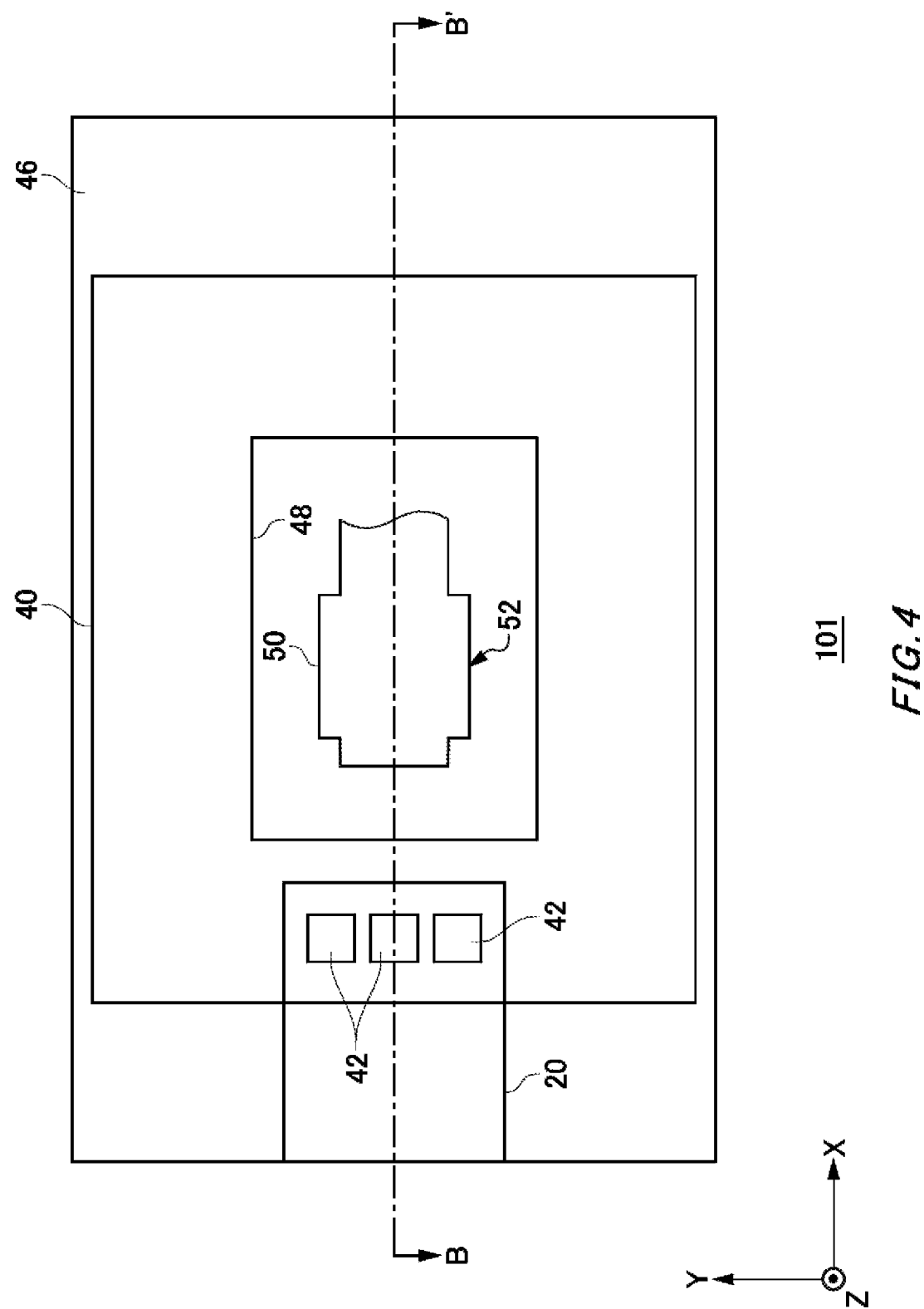
FIG. 4 shows a front surface of a semiconductor device 101 in a comparative example.
Figure 5:
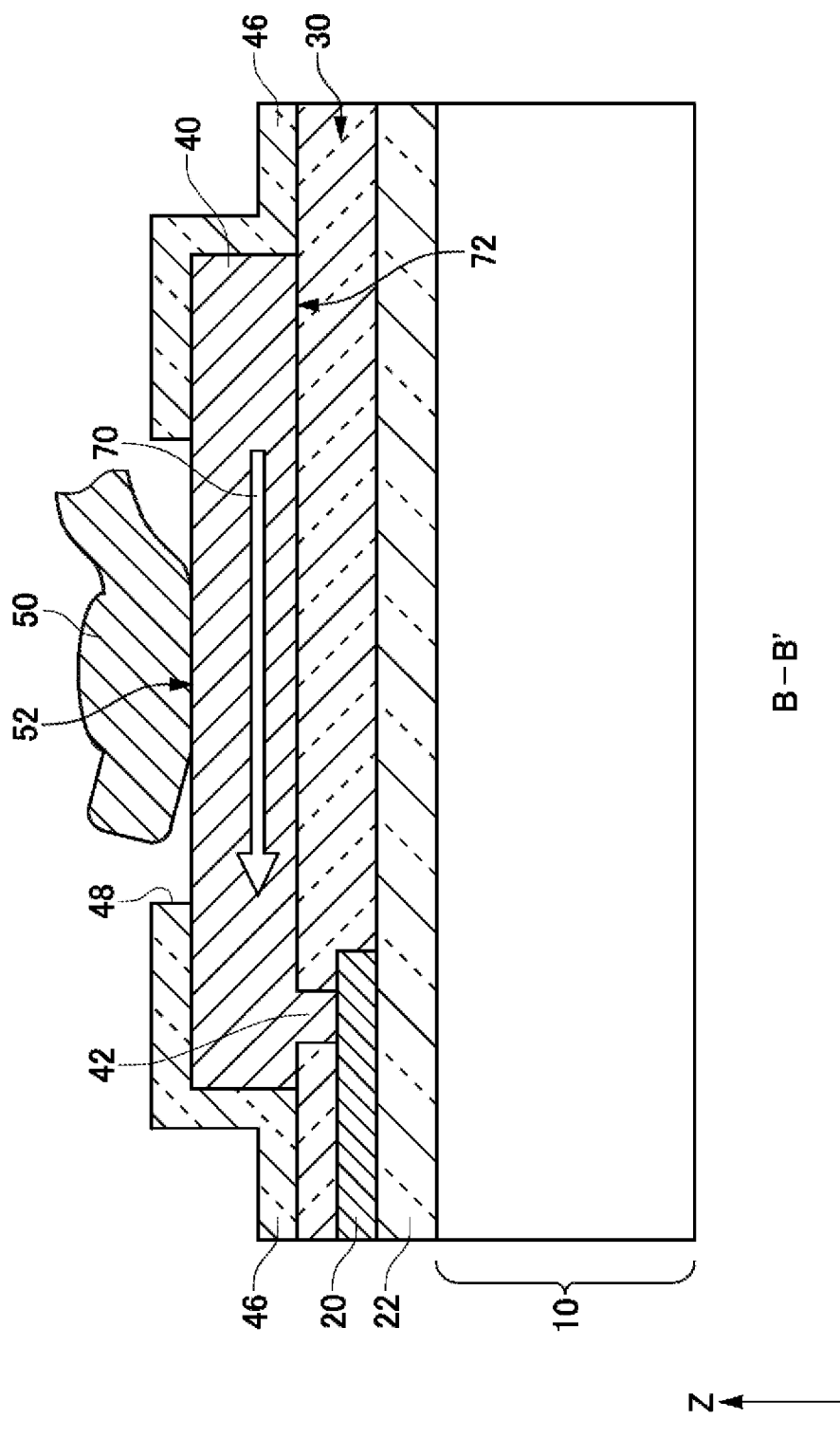
FIG. 5 shows one example of the cross section B-B' in FIG. 4.

The semiconductor device 100 of the first embodiment described using FIG. 1 to FIG. 3 is described while comparing to a comparative example. FIG. 4 shows a front surface of the semiconductor device 101 in a comparative example. FIG. 5 shows one example of the cross section B-B' in FIG. 4. As shown in FIG. 4 and FIG. 5, only the plurality of first vias 42 are provided in the semiconductor device 101 in the comparative example, as a plurality of vias. The semiconductor device 101 does not include the second via 44 arranged so as to opposite to the first via 42. Also, in the comparative example, the interlayer dielectric film 30 does not have the step portion 36. Further, because the interlayer dielectric film 30 does not have the step portion 36, no step is present on a lower surface of the second conductive film 40. Therefore, in the comparative example, an interface between the interlayer dielectric film 30 and the second conductive film 40 is flat. Except these points, the structure of the semiconductor device 101 in the comparative example is similar to the structure of the semiconductor device 100 in the first embodiment.

In the embodiment and the comparative example of the present invention, the second conductive film 40 is formed by the deposition process such as sputtering. The deposition process is performed at a temperature higher than room temperature. Also, the thermal expansion coefficient of the second conductive film 40 is different from the thermal expansion coefficient of another material layer such as the interlayer dielectric film 30. Therefore, during a cooling process after the deposition process, when the temperature of the second conductive film 40, the interlayer dielectric film 30 and the like is restored to the room temperature, residual stress occurs in the second conductive film 40. The residual stress is larger as the film thickness of the second conductive film 40 becomes larger.

As shown in FIG. 4 and FIG. 5, in the comparative example, the second conductive film 40 is connected to the first conductive film 20 through the first via 42. Therefore, due to the generated residual stress, the second conductive film 40 receives tensile stress 70 toward the first via 42. Because the second conductive film 40 is pulled toward the first via 42, there is a possibility that peeling of the second conductive film 40 occurs on an end 72 of the second conductive film 40 on an opposite side to the side on which the first via 42 is formed. The peeling of the second conductive film 40 may occur at an interface between the second conductive film 40 and the interlayer dielectric film 30, or inside the interlayer dielectric film 30.

On the other hand, the semiconductor device 100 of the first embodiment of the present invention has the first via 42 and the second via 44 at positions opposite to each other with the bonded portion 52 of the wire 50 being interposed therebetween. Therefore, the tensile stress in the second conductive film 40 is dispersed in a direction toward the first via 42 and a direction toward the second via 44. That is, the stress in the second conductive film 40 is relaxed. Accordingly, the peeling of the second conductive film 40 at the interface between the second conductive film 40 and the interlayer dielectric film 30, and the peeling inside the interlayer dielectric film 30 are prevented.

Further, in the semiconductor device 100 of the present embodiment, the step portion 36 is formed in the interlayer dielectric film 30 that is interposed between the first conductive film 20 and the second conductive film 40. Therefore, unevenness occurs on the interface between the interlayer dielectric film 30 and the second conductive film 40. When the second conductive film 40 is pulled in the direction toward the first via 42, the step portion 36 of the interlayer dielectric film 30 functions as a stopper to relax the stress. Therefore, the step portion 36 of the interlayer dielectric film 30 also contributes to the prevention of the peeling of the second conductive film 40.

As described above, according to the semiconductor device 100 of the present embodiment, because the stress of the second conductive film 40 can be relaxed, the thickness of the second conductive film 40 can be made thick. Therefore, an damage to an underlying layer such as the interlayer dielectric film 30 when ultrasonic bonding the wire 50 with the second conductive film 40 can be relaxed. Accordingly, a sufficient margin (margin range) for a condition such as ultrasonic intensity when ultrasonic bonding the wire 50 with the second conductive film 40 can be ensured.

Because the stress of the second conductive film 40 can be relaxed, long-term reliability of the semiconductor device 100 can be enhanced. Because the peeling of the second conductive film 40 can also be prevented during the manufacturing process of the semiconductor device 100, improved yield in the manufacturing process can be achieved. During the manufacturing process, because contamination caused by the conductive material of the second conductive film 40 that is peeled during the manufacturing process does not occur, a clean manufacturing process can be maintained.

Figure 6:
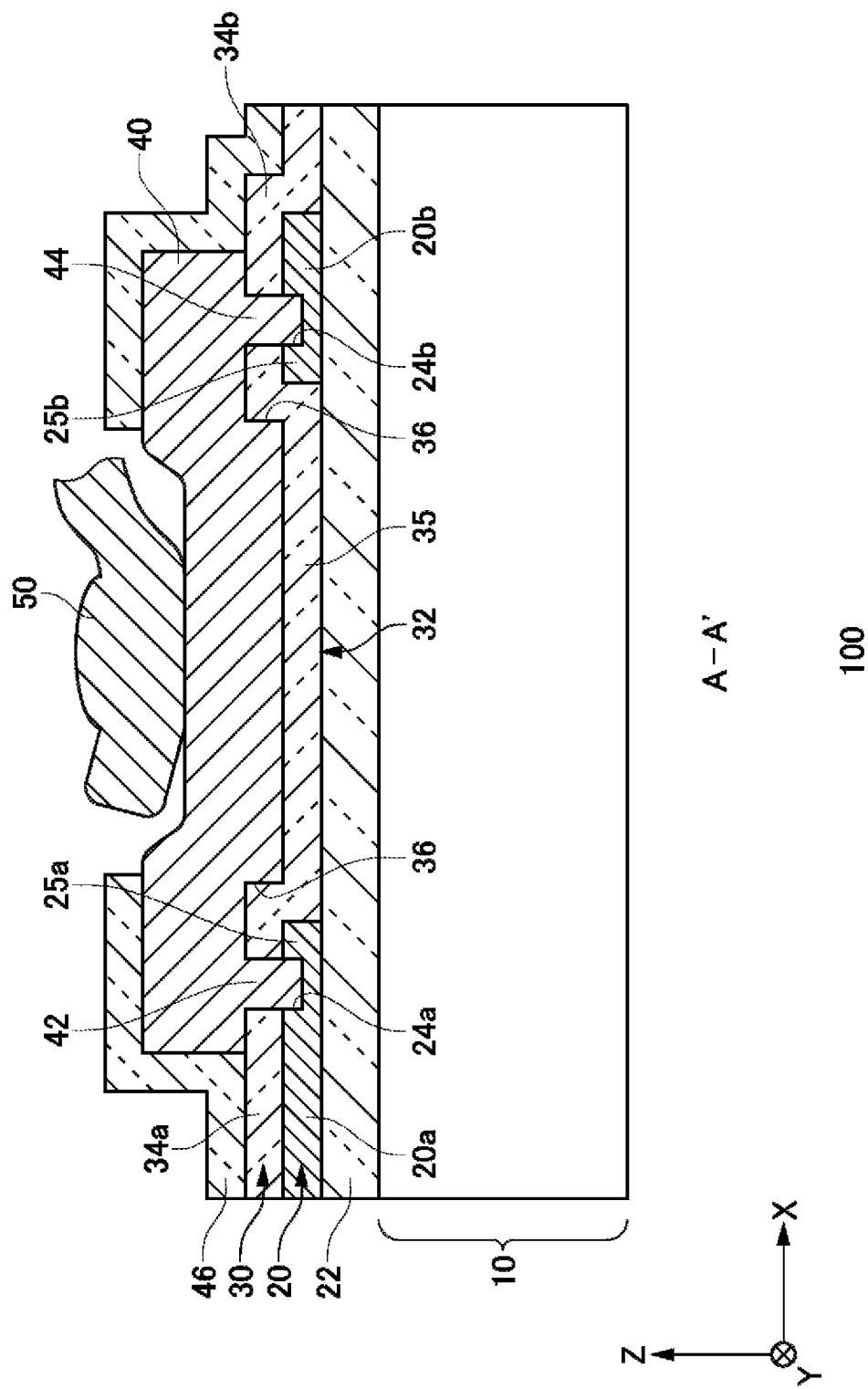
FIG. 6 shows one example of the cross section A-A' of the semiconductor device 100 in a second embodiment of the present invention.

FIG. 6 shows one example of the cross section A-A' of the semiconductor device 100 in a second embodiment of the present invention. The structure viewed from the front surface of the semiconductor device 100 of the second embodiment is similar to that in FIG. 1. The semiconductor device 100 in the second embodiment has a similar structure to the semiconductor device 100 of the first embodiment in FIG. 1 to FIG. 3, excluding the structure of the first conductive film 20 and the structures of the plurality of vias (42, 44). Therefore, repetitive descriptions for common parts are omitted.

The first conductive film 20 has groove portions (24a, 24b). In the present example, the groove portions (24a, 24b) include a plurality of first groove portions 24a and a plurality of second groove portions 24b. The plurality of first groove portions 24a are provided corresponding to positions on an XY plane in which the first vias 42 are provided in FIG. 1. Similarly, the plurality of second groove portions 24b are provided corresponding to the positions on the XY plane in which the second vias 44 are provided in FIG. 1.

When viewed from the positive Z-axis direction, the planar shape of the first groove portion 24a corresponds to the planar shape of the first via 42, and the planar shape of the second groove portion 24b corresponds to the planar shape of the second via 44. The first groove portion 24a and the second groove portion 24b are formed from the front surface side of the first conductive film 20 to the inside of the first conductive film 20 along the direction orthogonal to the semiconductor substrate 10 (the Z-axis direction).

It is preferable that the first groove portion 24a and the second groove portion 24b do not penetrate the back surface of the first conductive film 20. A depth of the first groove portion 24a and the second groove portion 24b may be ⅓ or more of and ⅔ or less of the thickness of the first conductive film 20. In a case where the via holes of the first via 42 and the second via 44 are to be formed in the interlayer dielectric film 30, the first groove portion 24a and the second groove portion 24b may be formed by extending the via holes to the inside of the first conductive film 20. To easily form the first groove portion 24a and the second groove portion 24b, the first conductive film 20 may be formed of a polysilicon film.

Ends of the plurality of vias (42, 44) are respectively inserted into the corresponding groove portions (24a, 24b). The ends of the plurality of first vias 42 are respectively inserted into the corresponding first groove portions 24a, and the ends of the plurality of second vias 44 are respectively inserted into the corresponding second groove portions 24b.

The first groove portion 24a and the second groove portion 24b may be formed apart from an edge of the first conductive film 20 (the wiring film 20a, the dummy film 20b) by a predetermined distance. In other words, the first conductive film 20 may include frame portions 25a and 25b that surround the neighborhood of the first groove portion 24a and the neighborhood of the second groove portion 24b. In the present example, the wiring film 20a has the frame portion 25a that surrounds the neighborhood of the first groove portion 24a. The dummy film 20b has the frame portion 25b that surrounds the neighborhood of the second groove portion 24b. By including the frame portions 25a and 25b, the intensity of the neighborhood of the first via 42 and the second via 44 can be enhanced.

As shown by the present example, by inserting the ends of the first via 42 and the second via 44 into the groove portions 24a and 24b provided in the first conductive film 20, the second conductive film 40 is firmly connected to the first conductive film 20 through the first via 42 and the second via 44. Therefore, the peeling of the second conductive film 40 can be prevented. In particular, because the first conductive film 20 has the frame portions 25a and 25b, resistance to the tensile stress of the second conductive film 40 can be enhanced compared to a case where the first conductive film 20 does not have the frame portions 25a and 25b.

Figure 7:
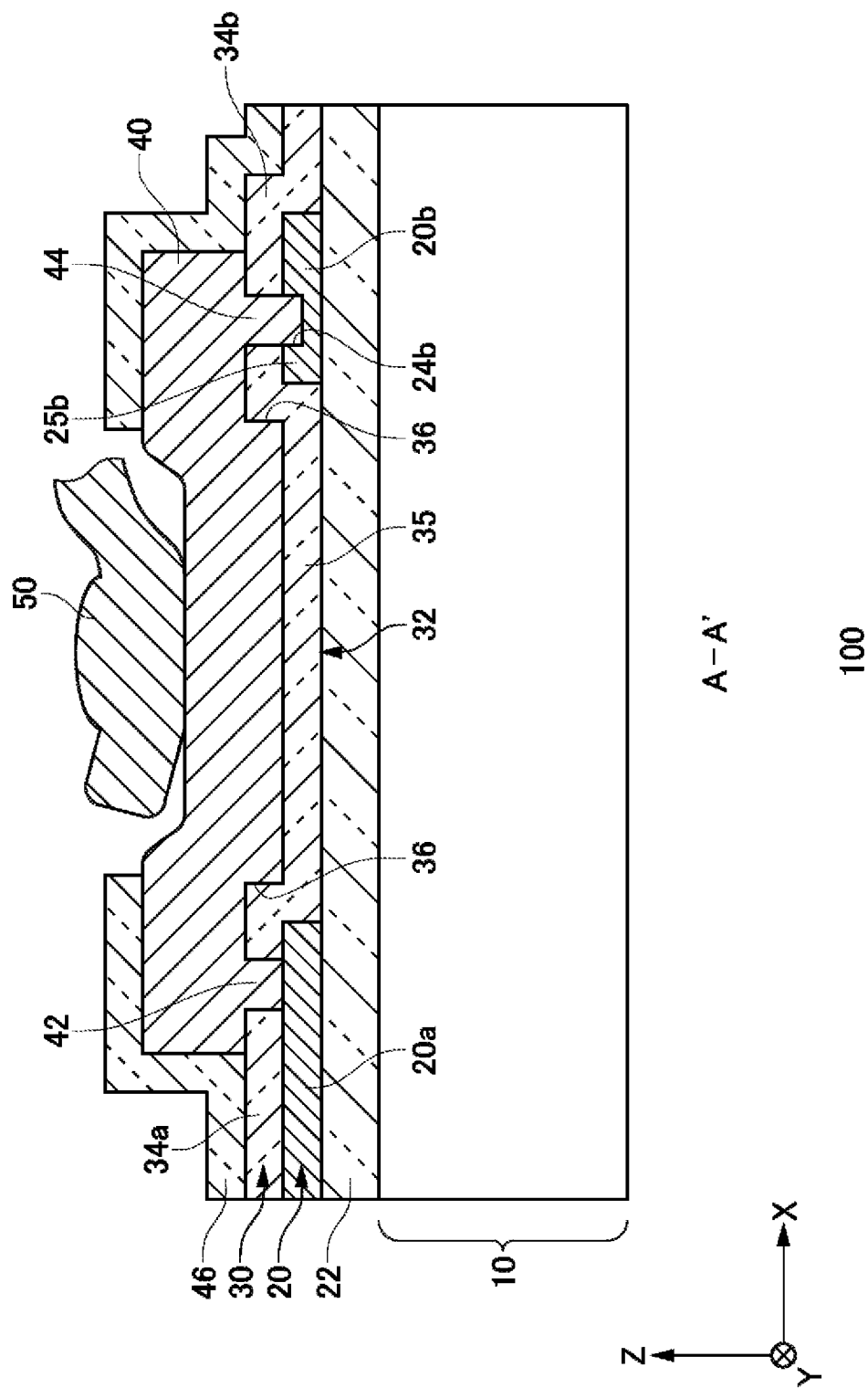
FIG. 7 shows one example of the cross section A-A' of the semiconductor device 100 in a third embodiment of the present invention.

FIG. 7 shows one example of the cross section A-A' of the semiconductor device 100 in a third embodiment of the present invention. The structure viewed from the front surface of the semiconductor device 100 of the third embodiment is similar to that in FIG. 1. The semiconductor device 100 of the third embodiment has the second groove portion 24b, but does not have the first groove portion 24a. Therefore, the second groove portion 24b is provided in the dummy film 20b. On the other hand, the first groove portion 24a is not provided in the wiring film 20a. Except this point, the semiconductor device 100 of the third embodiment has a similar structure to the semiconductor device 100 of the second embodiment shown in FIG. 6. Therefore, detailed descriptions for common parts are omitted.

The end of the second via 44 is inserted in to the second groove portion 24b. Therefore, compared to the first via 42 that is in contact with the wiring film 20a, the second via 44 that is in contact with the dummy film 20b has a deeper depth along the Z-axis direction. According to the present example as well, the peeling of the second conductive film 40 can be prevented.

Figure 8:
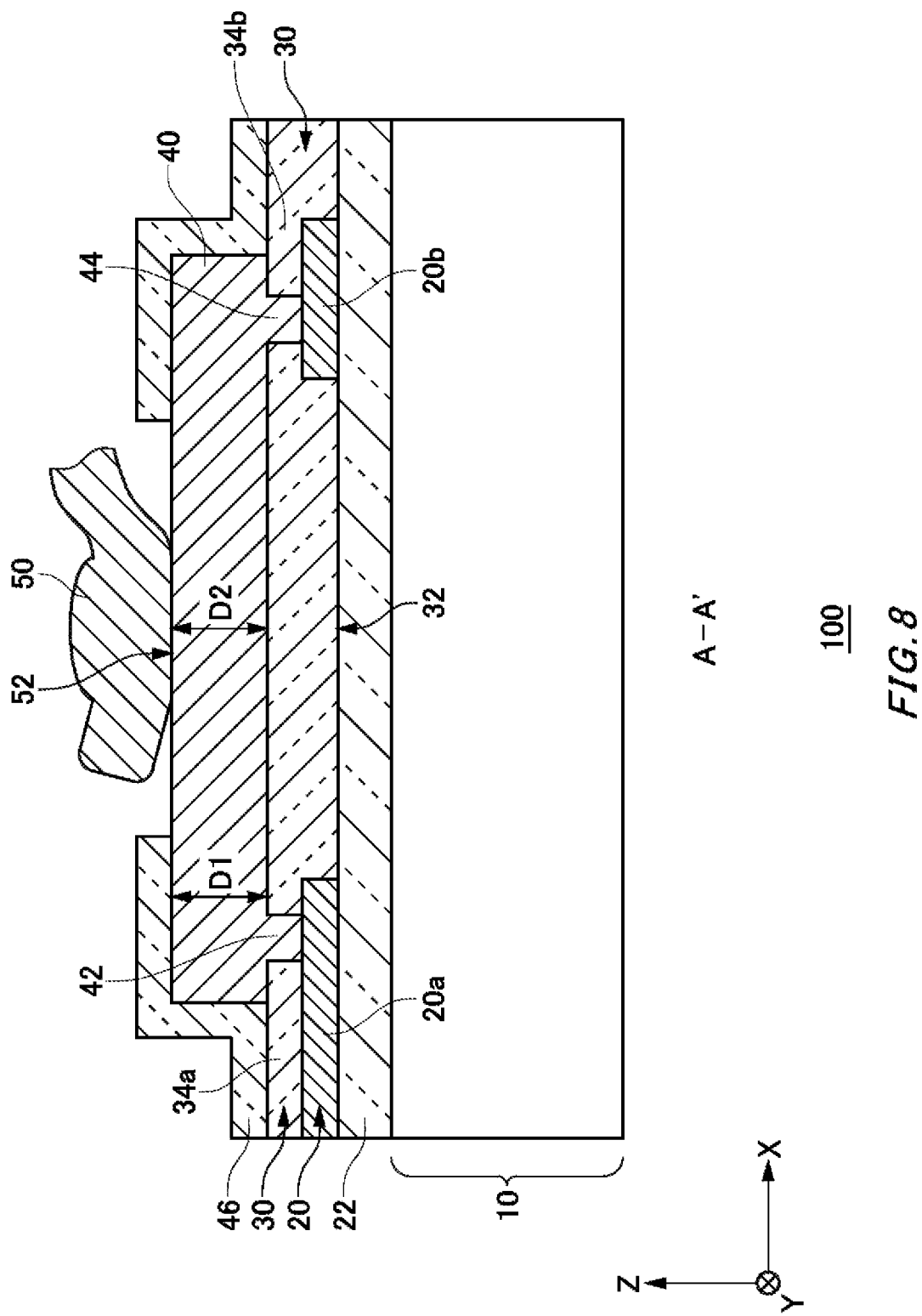
FIG. 8 shows one example of the cross section A-A' of the semiconductor device 100 in a fourth embodiment of the present invention.

FIG. 8 shows one example of the cross section A-A' of the semiconductor device 100 in a fourth embodiment of the present invention. The structure viewed from the front surface of the semiconductor device 100 of the fourth embodiment is similar to that in FIG. 1. The semiconductor device 100 of the present example includes the semiconductor substrate 10, the insulating film 22, the first conductive film 20, the interlayer dielectric film 30, the second conductive film 40, the wire 50 and the plurality of vias (42, 44). The first conductive film 20 is provided above the semiconductor substrate 10. The interlayer dielectric film 30 covers the first conductive film 20.

The second conductive film 40 is provided above the interlayer dielectric film 30. The wire 50 is bonded with the second conductive film 40. The plurality of vias (42, 44) penetrate the interlayer dielectric film 30 and electrically connect the first conductive film 20 and the second conductive film 40. The first conductive film 20 includes the wiring film 20a and the dummy film 20b. Current flows through the wiring film 20a. On the other hand, current does not flow through the dummy film 20b. The dummy film 20b is arranged on the opposite side to the wiring film 20a with the bonded portion 52 of the wire 50 being interposed therebetween.

The plurality vias (42, 44) include one or more first vias 42 and one or more second vias 44. The first via 42 electrically connects the wiring film 20a and the second conductive film 40. The second via 44 electrically connects the dummy film 20b and the second conductive film 40. The interlayer dielectric film 30 of the present example does not have the step portion 36. In particular, there is no step on the upper surface of the interlayer dielectric film 30. Also, because there is not step on the upper surface of the interlayer dielectric film 30, no step is present on the lower surface of the second conductive film 40. Therefore, an interface between the interlayer dielectric film 30 and the second conductive film 40 is flat.

In the semiconductor device 100 of the present example, the dummy film 20b is used as a film arranged on the opposite side to the wiring film 20a with the bonded portion 52 of the wire 50 being interposed therebetween. Because the dummy film 20b does not need to be connected to the circuit portion, the dummy film 20b does not need to be drawn to the position of the circuit portion. Therefore, an area occupied by the dummy film 20b may be smaller than an area of the wiring film 20a.

According to the present example, the dummy film 20b through which no current flows is provided, and then the second via 44 electrically connecting the dummy film 20b and a second conductive film 40 is provided. Therefore, in the semiconductor device 100, compared to the case where the wiring film 20a through which current flows is provided on both sides of the bonded portion 52 of the wire 50 such that the bonded portion 52 is interposed therebetween, the peeling of the second conductive film 40 can be prevented while space saving is achieved.

Figure 9:
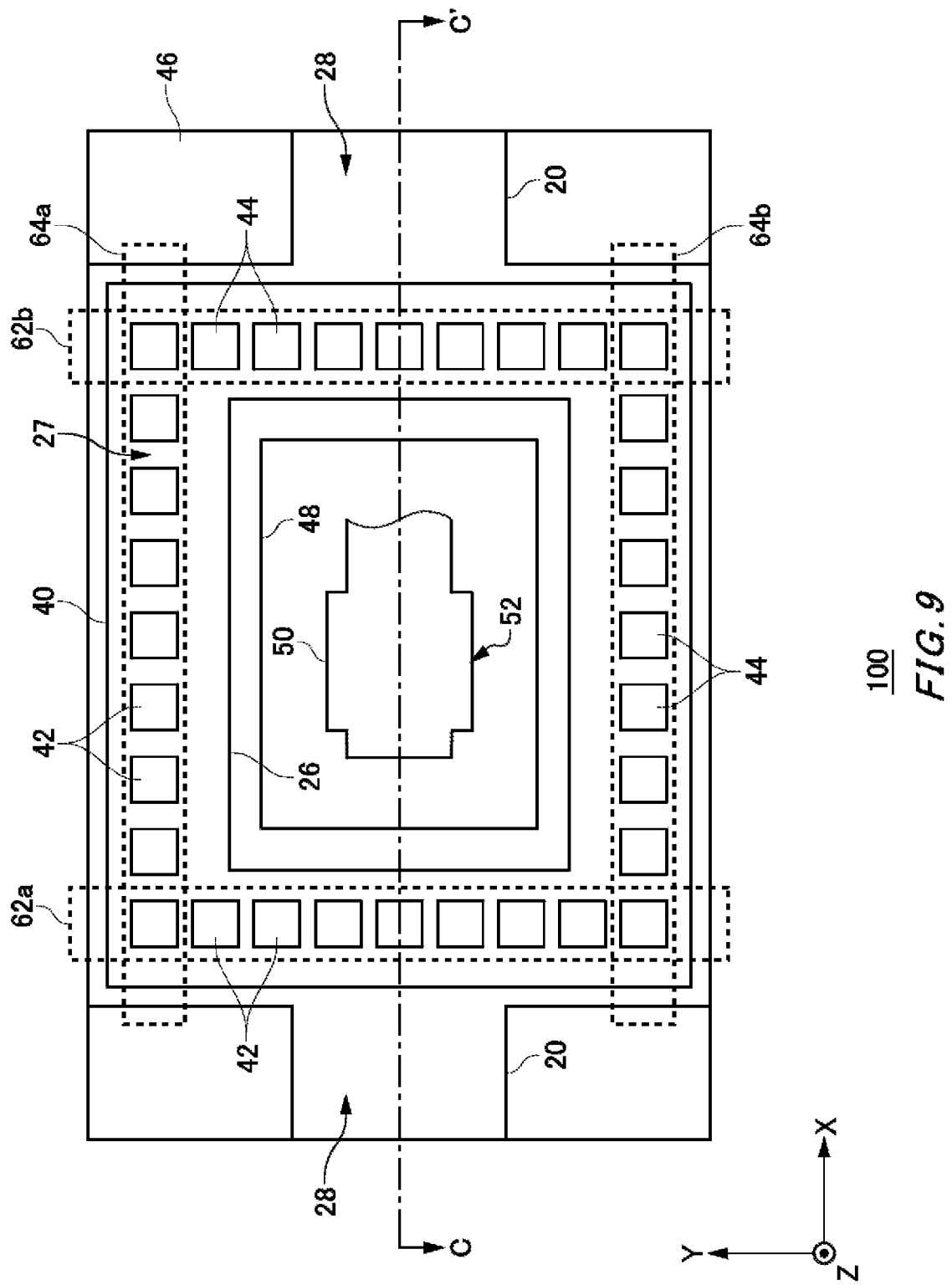
FIG. 9 shows a front surface of the semiconductor device 100 in a fifth embodiment of the present invention.
Figure 10:
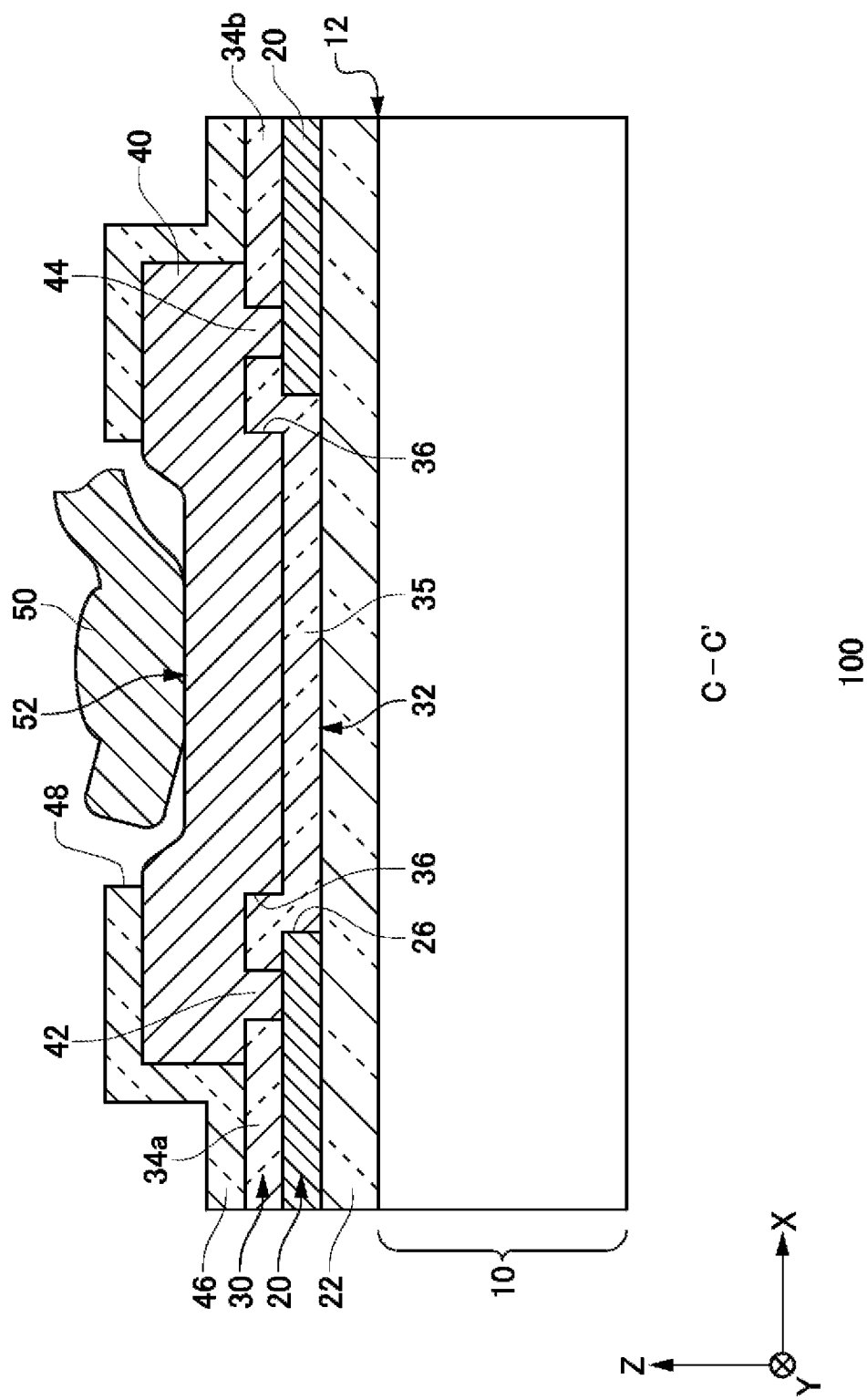
FIG. 10 shows one example of the cross section C-C' in FIG. 9.

FIG. 9 shows the front surface of the semiconductor device 100 in a fifth embodiment of the present invention. FIG. 10 shows one example of the cross section C-C' in FIG. 9. In the first to fourth embodiments, a configuration in which the first conductive film 20 is separated into two parts so as to sandwich the bonded portion 52 of the wire 50 is described. However, the present invention is not limited to this case. In the semiconductor device 100 of the fifth embodiment, the first conductive film 20 is formed in an annular shape surrounding the non-formation region 32. The non-formation region 32 may be an opening portion provided in the first conductive film 20. Except these structures, the structure of the semiconductor device 100 of the present example is similar to the structure of the semiconductor device 100 in the first to fourth embodiments. Therefore, repetitive descriptions are omitted.

The first conductive film 20 includes an annular portion 27 that is formed in an annular shape surrounding the non-formation region 32, and an extending portion 28 that extends from the annular portion 27 toward the outside. In the present example, one extending portion 28 extends toward the negative X-axis direction, and the other extending portion 28 is arranged so as to be opposite to the one extending portion 28 and extends toward the positive X-axis direction. In the present example, the first conductive film 20 is integrated as a whole, and the dummy film is not included. One or more extending portions 28 may extend to the circuit portion and be electrically connected to the circuit portion. Therefore, in the present example, the entire first conductive film 20 corresponds to a wiring portion. Current flows through the first conductive film 20.

As shown in FIG. 9, the plurality of vias (42, 44) are arranged in an annular shape surrounding the non-formation region 32. In the present example, the second conductive film 40 extends in the longitudinal direction parallel to the front surface 12 of the semiconductor substrate 10. In the present example, the X-axis direction is a longitudinal direction, and the Y-axis direction is a lateral direction. The lateral direction is a direction orthogonal to the longitudinal direction.

In the present example, a first region 62a in which a plurality of first vias 42 are arranged along a first short side that extends in the Y-axis direction of the second conductive film 40, and a second region 62b in which a plurality of second vias 44 are arranged along a second short side that is opposite to the first short side and extends in the Y-axis direction are provided. Similarly, a third region 64a in which a plurality of first vias 42 are arranged along a first long side that extends in the X-axis direction, and a fourth region 64b in which a plurality of second vias 44 are arranged along a second long side that is opposite to the first long side and extends in the X-axis direction are provided. Therefore, in the present example as well, the plurality of vias (42, 44) include one or more first vias 42 and one or more second vias 44 that are provided at positions opposite to each other with the bonded portion 52 of the wire 50 being interposed therebetween.

In the present example as well, the interlayer dielectric film 30 covers the first conductive film 20 and the non-formation region 32. The interlayer dielectric film 30 includes the first portion 35, the second portion 34 and the step portion 36. The first portion 35 is provided to an opening (non-formation region 32) provided in the first conductive film 20. The second portion 34 is provided above the first conductive film 20 surrounding the non-formation region 32. The step portion 36 of the interlayer dielectric film 30 connects the first portion 35 and the second portion 34. As shown in FIG. 10, the step portion 36 is provided in the Z-axis direction between an upper surface of the first portion 35 of the interlayer dielectric film 30 and an upper surface of the second portion 34 (34a and 34b) of the interlayer dielectric film 30.

According to the semiconductor device 100 of the fifth embodiment of the present invention, the plurality of first vias 42 and second vias 44 are provided so as to surround the non-formation region 32 that is an opening provided in the first conductive film 20. Therefore, the tensile stress of the second conductive film 40 is dispersed, and the stress in the second conductive film 40 is relaxed. Further, in the semiconductor device 100 of the present embodiment, the step portion 36 is formed on the interlayer dielectric film 30 interposed between the first conductive film 20 and the second conductive film 40. Therefore, unevenness occurs on an interface between the interlayer dielectric film 30 and the second conductive film 40. When the second conductive film 40 is pulled along a direction within the XY plane, the step portion 36 of the interlayer dielectric film 30 functions as a stopper to relax the stress. Therefore, the step portion 36 of the interlayer dielectric film 30 also contributes the prevention of the peeling of the second conductive film 40.

Figure 11:
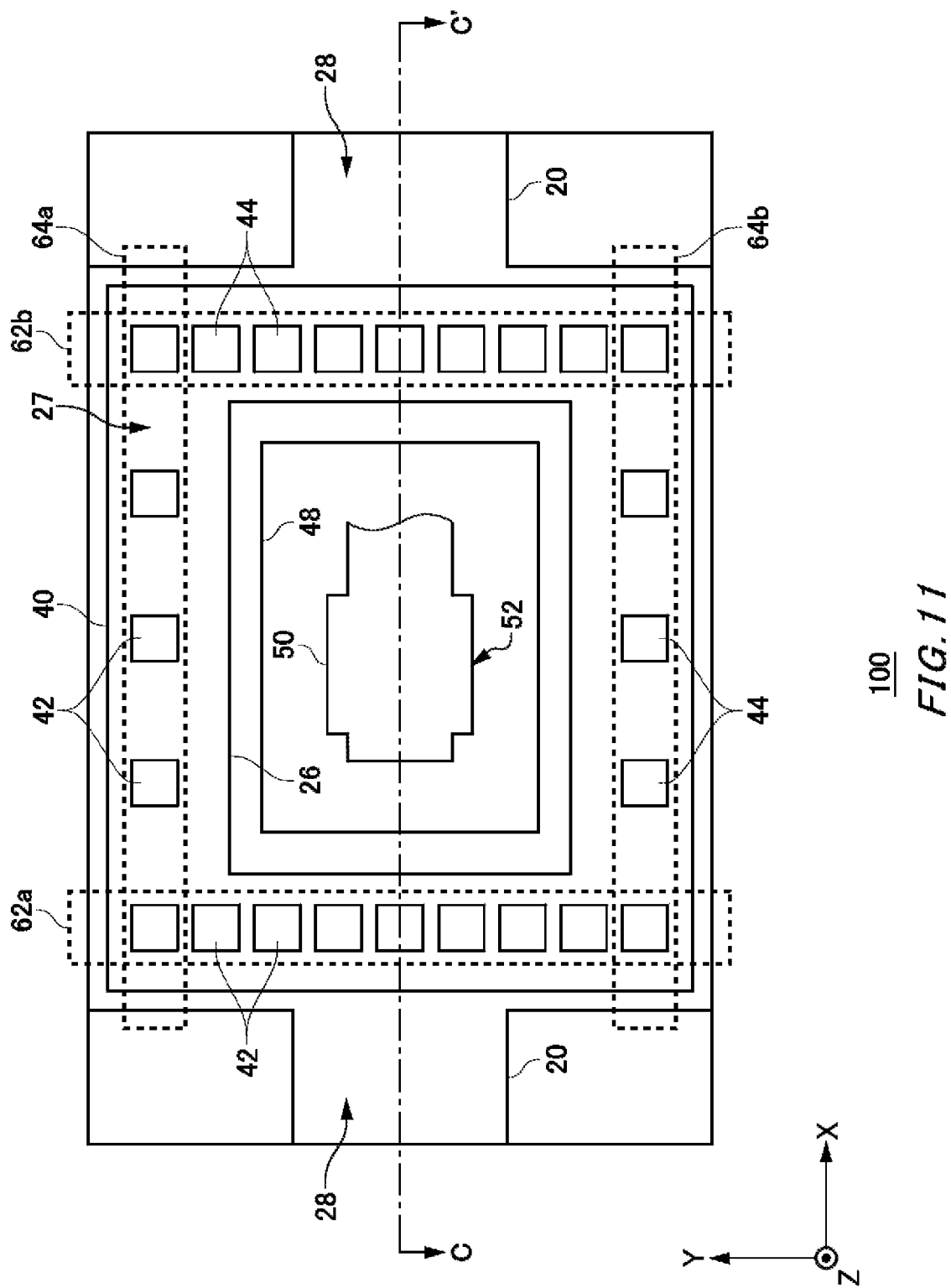
FIG. 11 shows a front surface of the semiconductor device 100 in a sixth embodiment of the present invention.

FIG. 11 shows the front surface of the semiconductor device 100 in a sixth embodiment of the present invention. The cross section C-C' in FIG. 11 is similar to that in FIG. 10. In the semiconductor device 100 of the present example, the density of the arranged plurality of vias (42, 44) is different according to the regions. The density of the vias (the through terminal portions) is the number of the vias (the through terminal portions) arranged per unit area. Except this point, the structure of the semiconductor device 100 of the present example is similar to the structure of the semiconductor device 100 in the fifth embodiment shown in FIG. 9 and FIG. 10. Therefore, repetitive descriptions are omitted.

In the present example as well, similar to the semiconductor device 100 in the fifth embodiment, the second conductive film 40 extends in the longitudinal direction (the X-axis direction). The density of the arranged plurality of vias (42, 44) in the first region 62a and the second region 62b is different from that in the third region 64a and the fourth region 64b. That is, the regions (the first region 62a, the second region 62b) in which the plurality of vias (42, 44) are arranged along the lateral direction (the Y-axis direction) orthogonal o the longitudinal direction (the X-axis direction) has a different density of the arranged vias (42, 44) from the regions (the third region 64a and the fourth region 64b) in which the plurality of vias (42, 44) are arranged along the longitudinal direction (the X-axis direction).

In the present example, the regions (the first region 62a and the second region 62b) in which the plurality of vias (42, 44) are arranged along the lateral direction (Y-axis direction) has a higher density of the arranged vias (42, 44) than the regions (the third region 64a and the fourth region 64b) in which the plurality of vias (42, 44) are arranged along the longitudinal direction (the X-axis direction).

In the present example, the density of the first vias 42 in the first region 62a in which the plurality of first vias 42 are arranged along the lateral direction is the same as the density of the second vias 44 in the second region 62b in which the plurality of second vias 44 are arranged along the lateral direction. Similarly, the density of the first vias 42 in the third region 64a in which the plurality of first vias 42 are arranged along the longitudinal direction is the same as the density of the second vias 44 in the fourth region 64b in which the plurality of second vias 44 are arranged along the longitudinal direction. However, the semiconductor device 100 of the present example is not limited to this case.

The tensile stress of the second conductive film 40 along the longitudinal direction becomes higher than the tensile stress of the second conductive film 40 along the lateral direction. Therefore, by making the density of the vias in the regions arranged in both end portions in the longitudinal direction, that is, in the first region 62a and the second region 62b higher than that in the regions arranged in both end portions in the lateral direction, the peeling of the second conductive film 40 is prevent even if the tensile stress is generated along the longitudinal direction.

Figure 12:
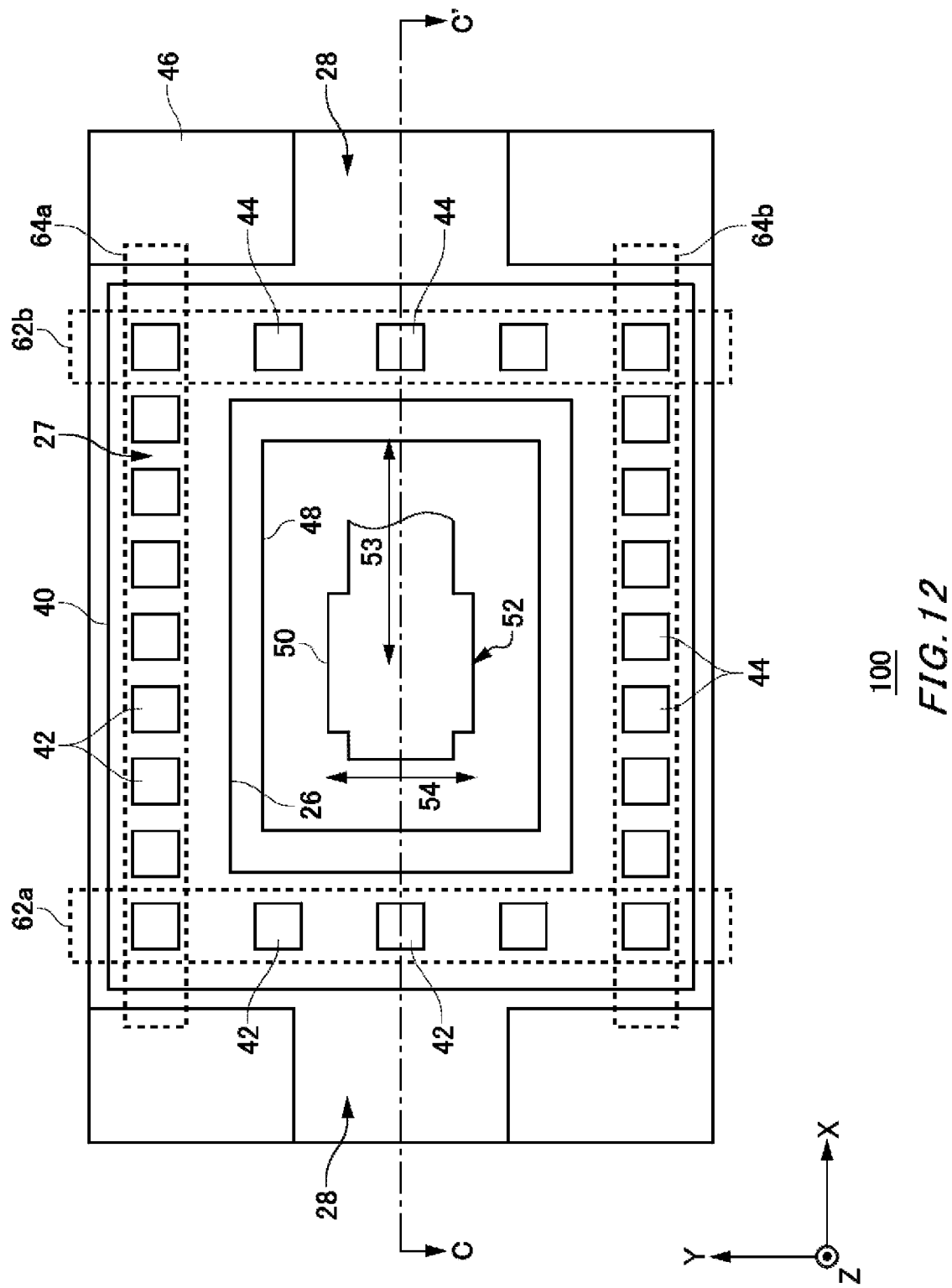
FIG. 12 shows a front surface of the semiconductor device 100 in a seventh embodiment of the present invention.

FIG. 12 shows a front surface of the semiconductor device 100 in the seventh embodiment of the present invention. The cross section C-C' in FIG. 12 is similar to that in FIG. 10. In the present example as well, the interlayer dielectric film 30 includes the step portion 36. In the present example as well, the second conductive film 40 extends in the longitudinal direction (X-axis direction). The wire 50 extends along an extending direction 53.

In the present example, the regions (the third region 64a and the fourth region 64b) in which a plurality of vias (42, 44) are arranged along a direction parallel to the extending direction 53 in which the wire 50 extends has a higher density of the arranged vias (42, 44) than the regions (the first region 62a and the second region 62b) in which the plurality of vias (42, 44) are arranged along a vibration direction 54 orthogonal to the extending direction 53 in which the wire 50 extends. Except this point, the structure of the semiconductor device 100 in the present embodiment is similar to the structure of the semiconductor device 100 in the sixth embodiment shown in FIG. 11. Therefore, repetitive descriptions are omitted.

In the present example, the density of the first vias 42 in the third region 64a in which the plurality of first vias 42 are arranged along the extending direction 53 is the same as the density of the second vias 44 in the fourth region 64b in which the plurality of second vias 44 are arranged along the extending direction 53. Similarly, the density of the first vias 42 in the first region 62a in which the plurality of first vias 42 are arranged along the vibration direction 54 orthogonal to the extending direction 53 is the same as the density of the second vias 44 in the second region 62b in which the plurality of second vias 44 are arranged along the vibration direction 54. However, the present example is not limited to this case.

When bonding the wire 50 with the second conductive film 40, force is easily applied to an end in the vibration direction 54 of an ultrasonic wave applied at the time of bonding. Therefore, by making the density of the vias in the regions arranged in both end portions in the vibration direction 54 of the ultrasonic wave, that is, in the third region 64a and the fourth region 64b, higher than that in the regions arranged in both end portions in a direction orthogonal to the vibration direction 54, the peeling of the second conductive film 40 is prevented even if the ultrasonic wave is applied at the time of ultrasonic bonding of the wire 50.

As can be seen in the illustrated example of FIG. 12, the plurality of first vias 42 arranged along the first long side (corresponding to the third region 64a), the plurality of second vias 44 arranged along the second long side (corresponding to the fourth region 64b), the plurality of first vias 42 arranged along the first short side (corresponding to the first region 62a), and the plurality of second vias 44 arranged along the second short side (corresponding to the second region 62b) all have square cross sections of equal size when viewed from a direction normal to the front surface 12 of the semiconductor substrate 10.

Figure 13:
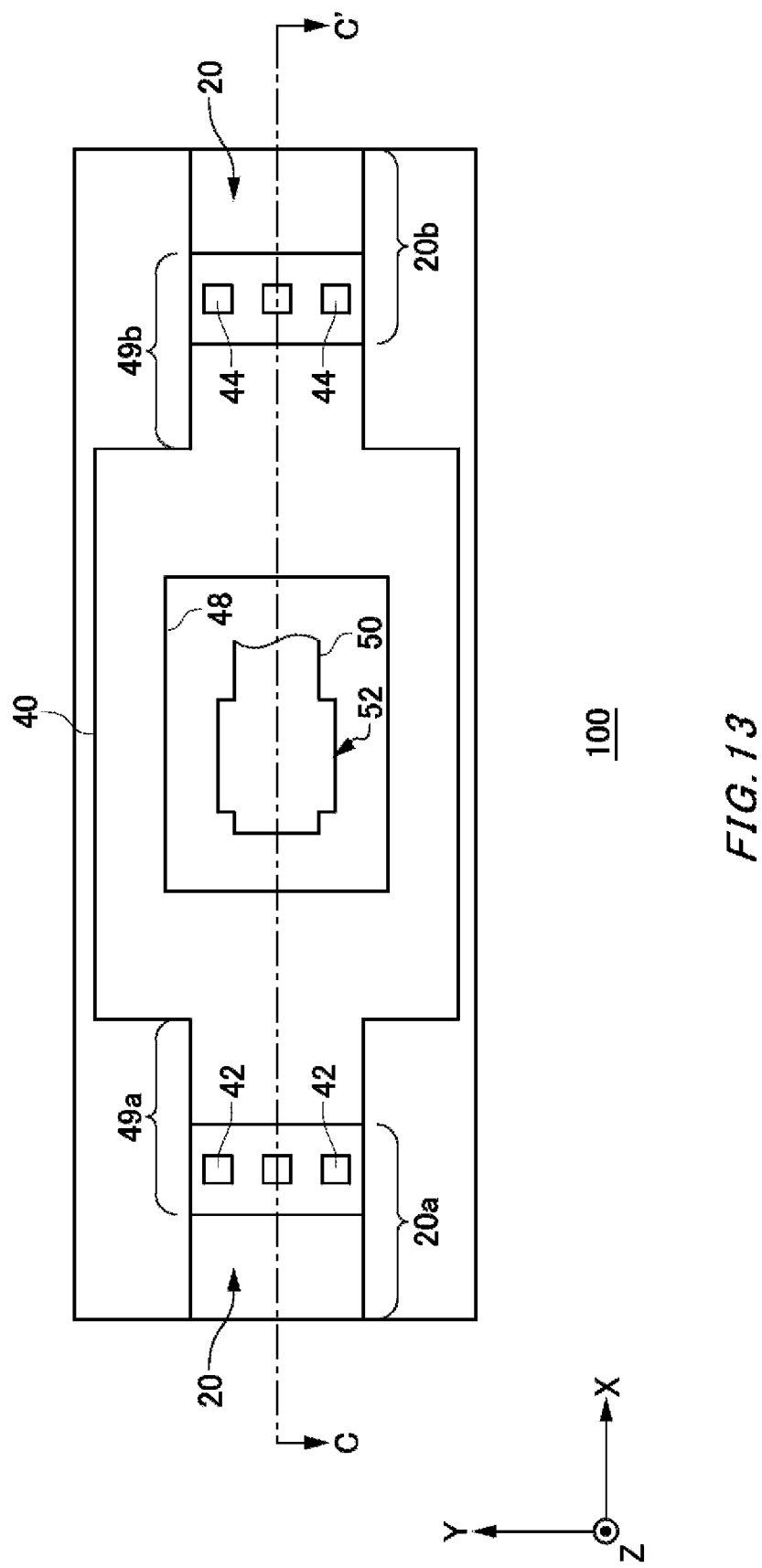
FIG. 13 shows a front surface of the semiconductor device 100 in a eighth embodiment of the present invention.

FIG. 13 shows the front surface of the semiconductor device 100 in a eighth embodiment of the present invention. The cross section C-C' in FIG. 13 is similar to that in FIG. 10. In the present example as well, the interlayer dielectric film 30 includes the step portion 36. In the present example, the second conductive film 40 may include the extending portion 49a and the extending portion 49b. In the example in FIG. 13, the second conductive film 40 has a main body part having a rectangular planar shape, and includes a first extending portion 49a and a second extending portion 49b at opposite positions in the longitudinal direction (the X-axis direction) of the main body part. Except this point, the configuration of the semiconductor device 100 in the present embodiment is similar to the configuration of the first to seventh embodiments. Therefore, repetitive descriptions are omitted.

In the present example, in the second conductive film 40, the first extending portion 49a and the second extending portion 49b extend from the main body part having a rectangular planar shape. However, the semiconductor device 100 of the present example is not limited to this case. The second conductive film 40 may have, as a planar shape, another shape such as a circular shape, an oval shape, a triangular shape and a polygonal shape, and the first extending portion 49a and the second extending portion 49b may extend from such a planar shape.

Figure 14:
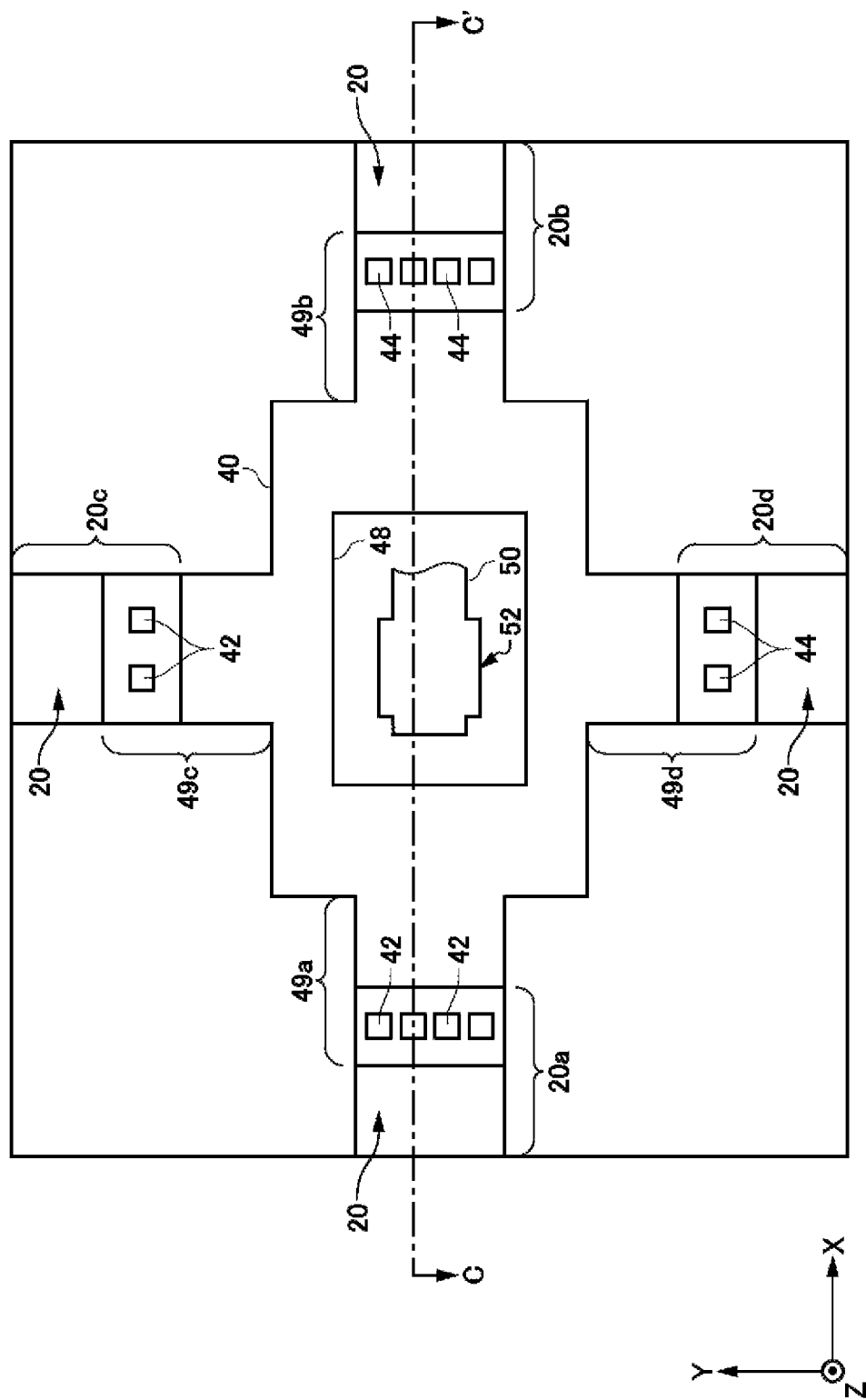
FIG. 14 shows a front surface of the semiconductor device 100 in a ninth embodiment of the present invention.

FIG. 14 shows a front surface of the semiconductor device 100 in a ninth embodiment of the present invention. The cross section C-C' in FIG. 14 is similar to that in FIG. 10. In the present example as well, the interlayer dielectric film 30 includes the step portion 36. The second conductive film 40 in the eighth embodiment shown in FIG. 13 includes the first extending portion 49a and the second extending portion 49b. On the other hand, the second conductive film 40 in the ninth embodiment includes the first extending portion 49a, the second extending portion 49b, a third extending portion 49c and a fourth extending portion 49d.

In the example in FIG. 14, the second conductive film 40 has a main body part having a rectangular planar shape. The first extending portion 49a and the second extending portion 49b are provided at opposite positions in the longitudinal direction (X-axis direction) of the main body part. Further, the third extending portion 49c and the fourth extending portion 49d are provided at opposite positions in the lateral direction (the Y-axis direction) of the main body part. In the example shown in FIG. 14, the second conductive film 40 includes, in the X-axis direction and the Y-axis direction, two pairs of extending portions (the first extending portion 49a and the second extending portion 49b, the third extending portion 49c and the fourth extending portion 49d) in total. However, the present example is not limited to this case. Three pairs or more of extending portions may also be provided, and the directions in which the extending portions extend are not limited to the X-axis direction and the Y-axis direction.

The first conductive film 20 may include extending portions (20a, 20b, 20c, and 20d) corresponding to the extending portions of the second conductive film 40. Also, in the present example as well, the vias (42, 44) may also be arranged such that, the density of the arranged plurality of vias (42, 44) is different according to the regions. In the example shown in FIG. 14, the regions (regions corresponding to the first extending portion 49a and the second extending portion 49b) in which the plurality of vias (42, 44) arranged along the lateral direction (the Y-axis direction) may have a higher density of the arranged plurality of vias (42, 44) than the regions (regions corresponding to the third extending portion 49c and the fourth extending portion 49d) in which the plurality of vias (42, 44) are arranged along the longitudinal direction (the X-axis direction).

According to the present example as well, the tensile stress of the second conductive film 40 is dispersed, and the stress in the second conductive film 40 is relaxed. Also, by the step portion 36 of the interlayer dielectric film 30 as well, the peeling of the second conductive film 40 is prevented.

Figure 15:
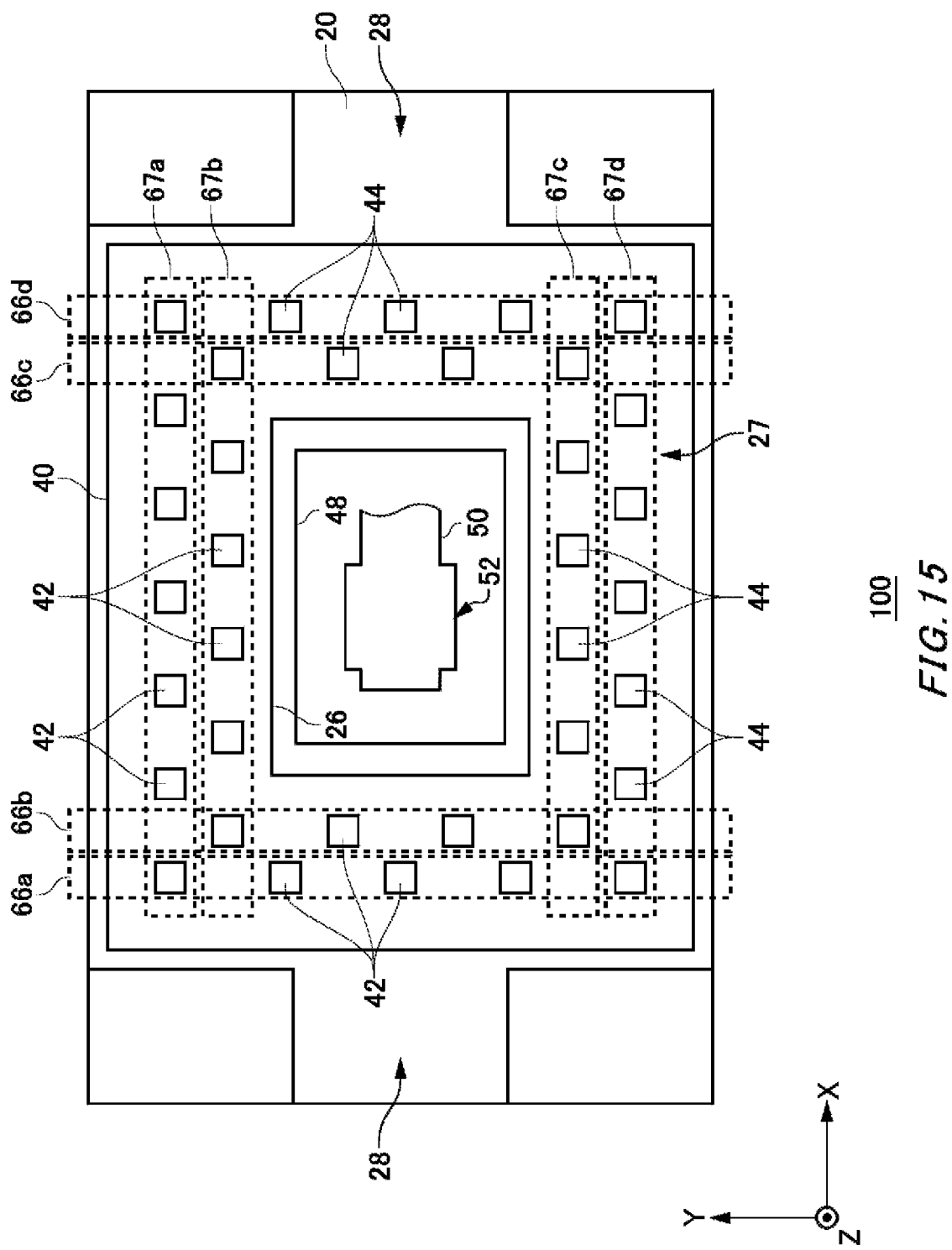
FIG. 15 shows a front surface of the semiconductor device 100 in a tenth embodiment of the present invention.

FIG. 15 shows the front surface of the semiconductor device 100 in a tenth embodiment of the present invention. In the semiconductor device 100 of the present example, a plurality of vias (42, 44) are arranged in a plurality of columns. Except this point, the structure of the semiconductor device 100 of the present example is similar to the structure of the semiconductor device 100 in the first to ninth embodiments. In particular, similar to the fifth embodiment shown in FIG. 9 and FIG. 10, the semiconductor device 100 of the present example may be arranged in an annular shape such that the plurality of vias (42, 44) surround the non-formation region 32. Comparing FIG. 9 to FIG. 15, it can be clearly known that in the present example, the plurality of vias (42, 44) are arranged in two concentric circles.

In the present example, on a first short side of the second conductive film 40, a plurality of first vias 42 arranged in a first column 66a along the Y-axis direction, and a plurality of first vias 42 arranged in a second column 66b adjacent to the first column 66a along the Y-axis direction are provided. The Y-axis direction is one example of one direction. The plurality of first vias 42 arranged in the first column 66a and the plurality of first vias 42 arranged in the second column 66b are arranged at positions in the Y-axis direction that are different from each other. In other words, the plurality of first vias 42 are arranged in a zigzag pattern.

On a second short side opposite to the first short side of the second conductive film 40, a plurality of second vias 44 arranged in a first column 66c along the Y-axis direction and a plurality of second vias 44 arranged in a second column 66d adjacent to the first column 66c along the Y-axis direction are provided. The plurality of second vias 44 arranged in the first column 66c and the plurality of second vias 44 arranged in the second column 66d are arranged at positions in the Y-axis direction that are different from each other. In other words, the plurality of second vias 44 are arranged in a zigzag pattern.

Further, in the present example, on a first long side of the second conductive film 40, a plurality of first vias 42 arranged in a first column 67a along the X-axis direction and a plurality of first vias 42 arranged in a second column 67b adjacent to the first column 67a along the X-axis direction are provided. The X-axis direction is one example of one direction. The plurality of first vias 42 arranged in the first column 67a and the plurality of first vias 42 arranged in the second column 67b are arranged at positions in the X-axis direction that are different from each other.

Similarly, on a second long side opposite to the first long side of the second conductive film 40, a plurality of second vias 44 arranged in a first column 67c along the X-axis direction and a plurality of second vias 44 arranged in a second column 67d adjacent to the first column 67c along the X-axis direction are provided. The plurality of second vias 44 arranged in the first column 67c and the plurality of second vias 44 arranged in the second column 67d are arranged at positions in the X-axis direction that are different from each other.

In the present example, although the plurality of vias (42, 44) are arranged in two columns, the plurality of vias (42, 44) may also be arranged in three columns or more. Also, in the present example, the plurality of vias (42, 44) are arranged such that the arranged positions in the extending directions of the columns are different from each other. In this manner, by arranging the plurality of vias (42, 44) such that the arranged positions in extending directions of the columns are different from each other, the intensity of the second conductive film 40 in in-plane direction of the front surface 12 of the semiconductor substrate 10 can be maintained. Also, by arranging the plurality of vias (42, 44) in a plurality of columns, the peeling of the second conductive film 40 is prevented.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

EXPLANATION OF REFERENCES

10 . . . semiconductor substrate; 12 . . . front surface; 20 . . . first conductive film; 20a . . . wiring film; 20b . . . dummy film; 22 . . . insulating film; 24 . . . groove portion; 25 . . . frame portion; 27 . . . annular portion; 28 . . . extending portion; 30 . . . interlayer dielectric film; 32 . . . non-formation region; 34 . . . second portion; 35 . . . first portion; 36 . . . step portion; 40 . . . second conductive film; 42 . . . first via; 44 . . . second via; 46 . . . protective film; 48 . . . opening; 49 . . . extending portion; 50 . . . wire; 52 . . . bonded portion; 53 . . . extending direction; 54 . . . vibration direction; 62a . . . first region; 62b . . . second region; 64a . . . third region; 64b . . . fourth region; 66a . . . first column; 66b . . . second column; 66c . . . first column; 66d . . . second column; 67a . . . first column; 67b . . . second column; 67c . . . first column; 67d . . . second column; 70 . . . tensile stress; 72 . . . end; 100 . . . semiconductor device; 101 . . . semiconductor device

What is claimed is:

1. A semiconductor device comprising:
a semiconductor substrate having a front surface;
first conductive film that is provided above the semiconductor substrate and surrounds a non-formation region in which the first conductive film is not provided such that the non-formation region is delineated by an opening portion in the first conductive film;
an interlayer dielectric film including a first portion that is provided in the non-formation region, second portions that are provided above the first conductive film surrounding the non-formation region, and a step portion that connects the first portion and the second portions of the interlayer dielectric film, wherein the non-formation region has a first long side extending in a longitudinal direction, a second long side extending in the longitudinal direction opposite the first long side, a first short side extending in a lateral direction, and a second short side extending in the lateral direction opposite the first short side;
a second conductive film that is provided above the interlayer dielectric film;
at least a plurality of first vias arranged along the first short side;
at least a plurality of second vias arranged along the second short side;
at least a plurality of first vias arranged along the first long side;
at least a plurality of second vias arranged along the second long side; and
a wire that is bonded with the second conductive film above the first portion of the interlayer dielectric film, above the non-formation region and not directly above the first conductive film, the second conductive film functioning as a wire bonding pad, wherein
the first conductive film is electrically connected to the second conductive film through the plurality of first vias arranged along the first short side, the plurality of second vias arranged along the second short side, the plurality of first vias arranged along the first long side, and the plurality of second vias arranged along the second long side,
a thickness of the second conductive film is larger than a thickness of the first conductive films,
the second conductive film extends in the longitudinal direction, which is parallel to the front surface of the semiconductor substrate,
the plurality of first vias arranged along the first long side and the plurality of second vias arranged along the second long side are arranged along a direction parallel to an extending direction in which the wire that is bonded with the second conductive film extends,
the plurality of first vias arranged along the first short side and the plurality of second vias arranged along the second short side are arranged along a direction orthogonal to the extending direction,
the longitudinal direction is orthogonal to the lateral direction,
the plurality of first vias arranged along the first long side and the plurality of second vias arranged along the second long side are arranged with a higher density of vias than the plurality of first vias arranged along the first short side and the plurality of second vias arranged along the second short side, and
wherein the extending direction and the direction orthogonal to the extending direction are both parallel to the front surface of the semiconductor substrate.

2. The semiconductor device according to claim 1, wherein a thickness of the second conductive film above the first portion is larger than a thickness of the second conductive film above the second portion.

3. The semiconductor device according to claim 1, wherein
the wire and the second conductive film are formed of a material containing copper.

4. The semiconductor device according to claim 1, wherein
a thickness of the second conductive film is 1 μm or more.

5. The semiconductor device according to claim 1, wherein
the first conductive film has a groove portion, and
ends of the vias are respectively inserted into the groove portion.

6. The semiconductor device according to claim 1, wherein
each of the plurality of first vias arranged along the first long side and the plurality of second vias arranged along the second long side are arranged in a plurality of columns,
each of the plurality of first vias arranged along the first short side and the plurality of second vias arranged along the second short side are arranged in a plurality of columns.

7. The semiconductor device according to claim 6, wherein
the plurality of first vias arranged along the first long side arranged in a first column along the longitudinal direction and the plurality of first vias arranged along the first long side arranged in a second column along the longitudinal direction adjacent to the first column are arranged at positions in the longitudinal direction that are different from each other,
the plurality of second vias arranged along the second long side arranged in a first column along the longitudinal direction and the plurality of second vias arranged along the second long side arranged in a second column along the longitudinal direction adjacent to the first column are arranged at positions in the longitudinal direction that are different from each other,
the plurality of first vias arranged along the first short side arranged in a first column along the lateral direction and the plurality of first vias arranged along the first short side arranged in a second column along the lateral direction adjacent to the first column are arranged at positions in the lateral direction that are different from each other, and
the plurality of second vias arranged along the second short side arranged in a first column along the lateral direction and the plurality of second vias arranged along the second short side arranged in a second column along the lateral direction adjacent to the first column are arranged at positions in the lateral direction that are different from each other.

8. The semiconductor device according to claim 1, wherein
the vias are formed such that a part of the second conductive film is embedded in a via hole that is provided in the interlayer dielectric film.

9. The semiconductor device according to claim 1, wherein
the first plurality of first through terminal portions includes at least three first through terminal portions, and
the first plurality of second through terminal portions includes at least three second through terminal portions.

10. The semiconductor device according to claim 1, wherein
the plurality of first vias arranged along the first long side, the plurality of second vias arranged along the second long side, the plurality of first vias arranged along the first short side, and the plurality of second vias arranged along the second short side all have square cross sections of equal size when viewed from a direction normal to the front surface of the semiconductor substrate.

11. A semiconductor device comprising:

a semiconductor substrate;

first conductive films that are provided above the semiconductor substrate, the first conductive films including a wiring film through which current flows and a dummy film, a non-formation region, in which the first conductive films are not provided, being interposed between the wiring film and the dummy film;

an interlayer dielectric film that covers the first conductive films, the interlayer dielectric film including a first portion that is provided in the non-formation region, second portions that are provided above the wiring film and on the dummy film on both sides of the non-formation region such that the non-formation region is interposed between the second portions, a first step portion connecting the first portion and the second portion over the wiring film, a second step portion connecting the first portion and the second portion over the dummy film;

a second conductive film that is provided above the interlayer dielectric film;

a wire that is bonded with the second conductive film; and a plurality of through terminal portions that penetrate the interlayer dielectric film and electrically connect the first conductive films and the second conductive film, wherein the first step portion and the second step portion are free from overlap by bonding between the wire and the second conductive film, a bonded portion of the wire is interposed between the wiring film and the dummy film, and no current flows through the dummy film, the plurality of through terminal portions at least include one or more first through terminal portions that electrically connect the wiring film and the second conductive film, and one or more second through terminal portions that electrically connect the dummy film and the second conductive film, the second conductive film extending between the first step portion and the second step portion and at least for the entire bonded portion between the wire and the second conductive film has a first uniform thickness, the second conductive film above the second portions of the interlayer dielectric film on both sides of the non-formation region having a second uniform thickness, the first uniform thickness being larger than the second uniform thickness, wherein the second conductive film has an upper surface and there is no step on the upper surface of the second conductive film, and wherein the second conductive film overlying the first step portion, the second step portion, and the second portions of the interlayer dielectric film is entirely of the second uniform thickness excluding material inside the plurality of through terminal portions.

12. The semiconductor device according to claim 11, wherein
an area occupied by the dummy film is smaller than an area of the wiring film.

13. The semiconductor device according to claim 11, wherein
   the dummy film has a groove portion,
   ends of the plurality of through terminal portions are respectively inserted into the groove portion and provided within the dummy film, and
   the wiring film does not have a groove portion.

* * * * *